US012740004B2

(12) United States Patent
Nishida et al.

(10) Patent No.: US 12,740,004 B2
(45) Date of Patent: Sep. 15, 2026

(54) ELECTRONIC APPARATUS

(71) Applicant: NINTENDO CO., LTD., Kyoto (JP)

(72) Inventors: Takafumi Nishida, Kyoto (JP); Kohei Matsumoto, Kyoto (JP)

(73) Assignee: NINTENDO CO., LTD., Kyoto (JP)

( * ) Notice: Subject to any disclaimer, the term of this patent is extended or adjusted under 35 U.S.C. 154(b) by 288 days.

(21) Appl. No.: 18/762,127

(22) Filed: Jul. 2, 2024

(65) Prior Publication Data

US 2025/0024631 A1 Jan. 16, 2025

(30) Foreign Application Priority Data

Jul. 11, 2023 (JP) ................................ 2023-113972

(51) Int. Cl.
*H05K 7/20* (2006.01)
*H05K 1/02* (2006.01)
(Continued)

(52) U.S. Cl.
CPC ....... *H05K 7/20145* (2013.01); *H05K 1/0209* (2013.01); *H05K 5/0086* (2013.01);
(Continued)

(58) Field of Classification Search
CPC ........... H05K 7/20145; H05K 7/20154; H05K 7/20172; H05K 1/0209; H05K 5/04; H05K 5/0086
(Continued)

(56) References Cited

U.S. PATENT DOCUMENTS 5,960,861 A * 10/1999 Price ..................... F28F 13/003 165/170
5,983,997 A * 11/1999 Hou ........................ F28F 3/027 257/722

(Continued)

FOREIGN PATENT DOCUMENTS

EP 3 595 421 1/2020
JP 2001111275 A 4/2001

(Continued)

OTHER PUBLICATIONS

Dec. 10, 2024 Search Report issued in European Patent Application No. 24186292.9, pp. 1-10.

*Primary Examiner* — Zhengfu J Feng
(74) *Attorney, Agent, or Firm* — Nixon & Vanderhye PC

(57) ABSTRACT

An electronic apparatus 1 has: a housing having an intake opening; a fan and a board housed in the housing; and a first and second heat generating components mounted on a first and second surface of the board, respectively. A first and second flow paths guiding air flowing in from the intake opening to the fan are formed in the housing. The first flow path includes a space on the first surface having the first heat generating component, and the second flow path includes a space on the second surface having the second heat generating component. In a direction perpendicular to the board, a distance between the first surface and its facing surface is longer than a distance between the second surface and its facing surface. The heat amount generated by the first heat generating component is larger than the heat amount generated by the second heat generating component.

13 Claims, 8 Drawing Sheets

(51) Int. Cl.
*H05K 5/00* (2006.01)
*H05K 5/04* (2006.01)

(52) U.S. Cl.
CPC ........... *H05K 5/04* (2013.01); *H05K 7/20154* (2013.01); *H05K 7/20172* (2013.01)

(58) Field of Classification Search
USPC .................................................... 361/679.49
See application file for complete search history.

(56) References Cited

U.S. PATENT DOCUMENTS 8,148,859 B2 * 4/2012 Yoshida ................. H02K 5/203 310/52
2008/0180910 A1 7/2008 Tomioka
2009/0168346 A1 7/2009 Miyoshi
2010/0147492 A1 * 6/2010 Conry ................. F28D 15/0266 165/104.31
2011/0279974 A1 11/2011 Fujiwara
2015/0183456 A1 7/2015 Nishimura

FOREIGN PATENT DOCUMENTS

WO 2006/126693 11/2006
WO 2014/021046 2/2014

* cited by examiner 30
32
34
33
35b(35)
35a(35)
51a(51)
51b(51)
31
50
40
70
72
60
75
42
10
23
21
20
22
24
25
5
1
TOP
BOTTOM
BACK
FRONT
LEFT
RIGHT 20
22
23
26
26a
26b
27a(27)
27b(27)
28
29
TOP
BOTTOM
LEFT
RIGHT

FIG. 4

40
41
42a(42)
42b(42)
43a(43)
43b(43)
43c(43)
46a(46)
46b(46)
47
TOP
BOTTOM
LEFT
RIGHT 26
75
26a
26b
62
61
60
34
VII
VI
L1l
X1
35a(35)
42
L1r
C
81
L2l
X2
35b(35)
70
43
40
44
45
L2r
TOP
BOTTOM
LEFT
RIGHT 1
31
70
45
30
86
92
50
44
40
43a(43)
91
5
43c(43)
28
D1
D2
20
33
35b(35)
TOP
BACK
FRONT
BOTTOM

46b(46)
51b(51)
82
28
40
46a(46)
81
50
27a(27)
30
5
83
51a(51)
27b(27)
TOP
BACK
FRONT
BOTTOM

ELECTRONIC APPARATUS

CROSS-REFERENCE TO RELATED APPLICATION

This application claims priority to JP 2023-113972 filed Jul. 11, 2023, the entire contents of which are hereby incorporated by reference.

FIELD

The present disclosure relates to an electronic apparatus.

BACKGROUND

Known since the past has been an electronic apparatus having a housing having an intake opening and an exhaust opening and a board on which a heat generating component is mounted in the housing (for example, JP 2001-111275 A). In particular, the electronic apparatus described in JP 2001-111275 A has a fan arranged in a hole provided in the board and is configured so that air sucked in from the intake opening passes below the board to flow to the fan, then the air flowing out from the fan passes above the board to flow to the exhaust opening.

However, in the electronic apparatus described in JP 2001-111275 A, there is room for improvement in dissipating the heat generated from the heat generating component.

SUMMARY

The gist of the present disclosure is as follows:

(1) An electronic apparatus to and from which air from the outside flows,
the electronic apparatus comprising:
a housing at which an intake opening is provided;
a fan housed in the housing;
a board housed in the housing;
one or more first heat generating component mounted on a first surface of the board; and
one or more second heat generating component mounted on a second surface of the board at an opposite side to the first surface, wherein
a first flow path and a second flow path guiding air flowing in from the intake opening to the fan are formed in the housing,
the first flow path is formed at least in part by the first surface and a first facing surface facing the first surface,
the second flow path is formed at least in part by the second surface and a second facing surface facing the second surface,
in a direction perpendicular to the board, a distance between the first surface and the first facing surface at the first flow path is longer than a distance between the second surface and the second facing surface at the second flow path, and
a total amount of heat generated of the first heat generating components as a whole is larger than a total amount of heat generated of the second heat generating components as a whole, or an amount of heat generated by a component with a largest amount of heat generated among the first heat generating components is larger than an amount of heat generated by a component with a largest amount of heat generated among the second heat generating components.

(2) The electronic apparatus according to above (1), wherein
the first facing surface is formed by a first metal sheet arranged so as to face the first surface,
the second facing surface is formed by a second metal sheet arranged so as to face the second surface, and
at least part of the housing is formed by the first metal sheet or the second metal sheet.

(3) The electronic apparatus according to above (2), wherein the first metal sheet is connected to at least one of the first heat generating component and the board by a heat conductive first connecting member.

(4) The electronic apparatus according to above (2) or (3), wherein the second metal sheet is connected to at least one of the second heat generating component and the board by a heat conductive second connecting member.

(5) The electronic apparatus according to above (3), wherein at least a part of the first connecting members connects the first metal sheet and a first interconnect pattern provided at the board.

(6) The electronic apparatus according to above (5), wherein
the first interconnect pattern is electrically connected to a ground potential of the electronic apparatus, and
the first metal sheet is arranged so as to overlap at least a part of the first heat generating components when viewed in a direction perpendicular to the board.

(7) The electronic apparatus according to above (4), wherein at least a part of the second connecting members connects the second metal sheet and a second interconnect pattern provided at the board.

(8) The electronic apparatus according to above (7), wherein
the second interconnect pattern is electrically connected to a ground potential of the electronic apparatus, and
the second metal sheet is arranged so as to overlap at least a part of the second heat generating components when viewed in a direction perpendicular to the board.

(9) The electronic apparatus according to above (2), wherein
the fan is attached at the second metal sheet, has a fan second surface facing the second metal sheet in a direction perpendicular to the board and a fan first surface at the opposite side to the fan second surface, and has an inflow opening formed at the fan first surface and an inflow opening formed at the fan second surface,
the first facing surface faces the inflow opening formed at the fan first surface while the second facing surface faces the inflow opening formed at the fan second surface, and
a distance between the inflow opening formed at the fan first surface and the first facing surface is longer than a distance between the inflow opening formed at the fan second surface and the second facing surface.

(10) The electronic apparatus according to above (1), wherein the component with the largest amount of heat generated among the first heat generating components is arranged so as to be at least partially positioned in a space between the intake opening and the inflow openings of the fan when viewed in a direction perpendicular to the board.

(11) The electronic apparatus according to above (1) or (10), wherein a component with a largest amount of heat generated among the second heat generating components is arranged so as to at least partially be positioned in a space between the intake openings and the inflow openings of the fan when viewed in a direction perpendicular to the board.

(12) The electronic apparatus according to above (1) or (2), wherein the intake opening has two intake openings of a first intake opening and second intake opening arranged away from each other on the same surface of the housing, a component with a largest amount of heat generated among the first heat generating components is arranged so as to at least partially be positioned in a space between the first intake opening and an inflow opening of the fan when viewed in a direction perpendicular to the board, and a component with a largest amount of heat generated among the second heat generating components is arranged so as to at least partially be positioned in a space between the second intake opening and the inflow opening when viewed in a direction perpendicular to the board.

(13) The electronic apparatus according to above (12), further comprising a battery arranged in the housing, wherein the battery is arranged more in proximity to a space between the second intake opening and the inflow opening than a space between the first intake opening and the inflow opening.

BRIEF DESCRIPTION OF DRAWINGS

Embodiments of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4 is a plan view showing a board seen from the back.

DESCRIPTION OF EMBODIMENTS

Figure 1:
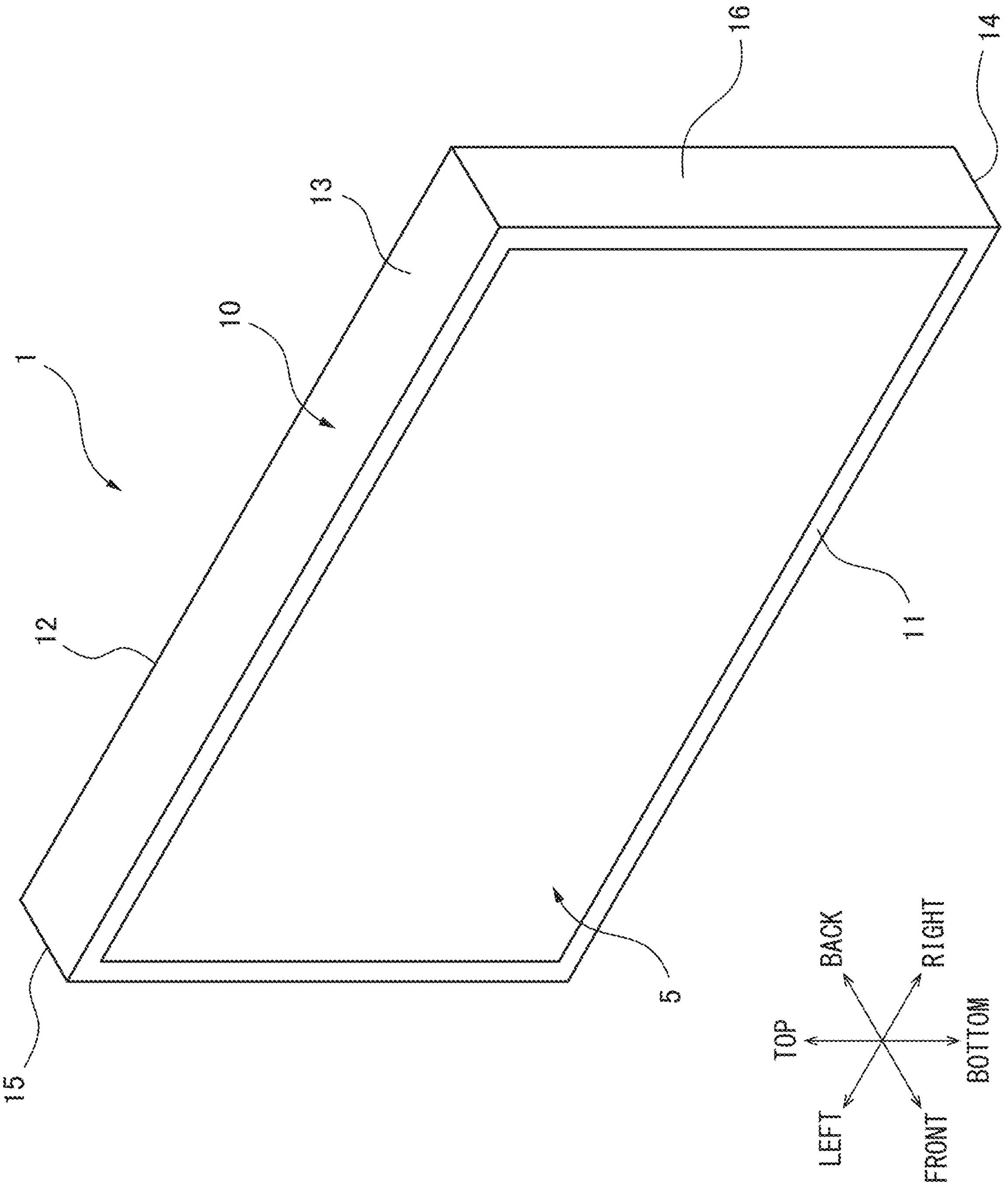
FIG. 1 is a schematic perspective view showing an electronic apparatus seen from the front top.

Below, referring to the figures, embodiments will be explained in detail. It should be noted that, in the following explanation, similar components are assigned the same reference numerals.

Overall Configuration of Electronic Apparatus

Figure 2:
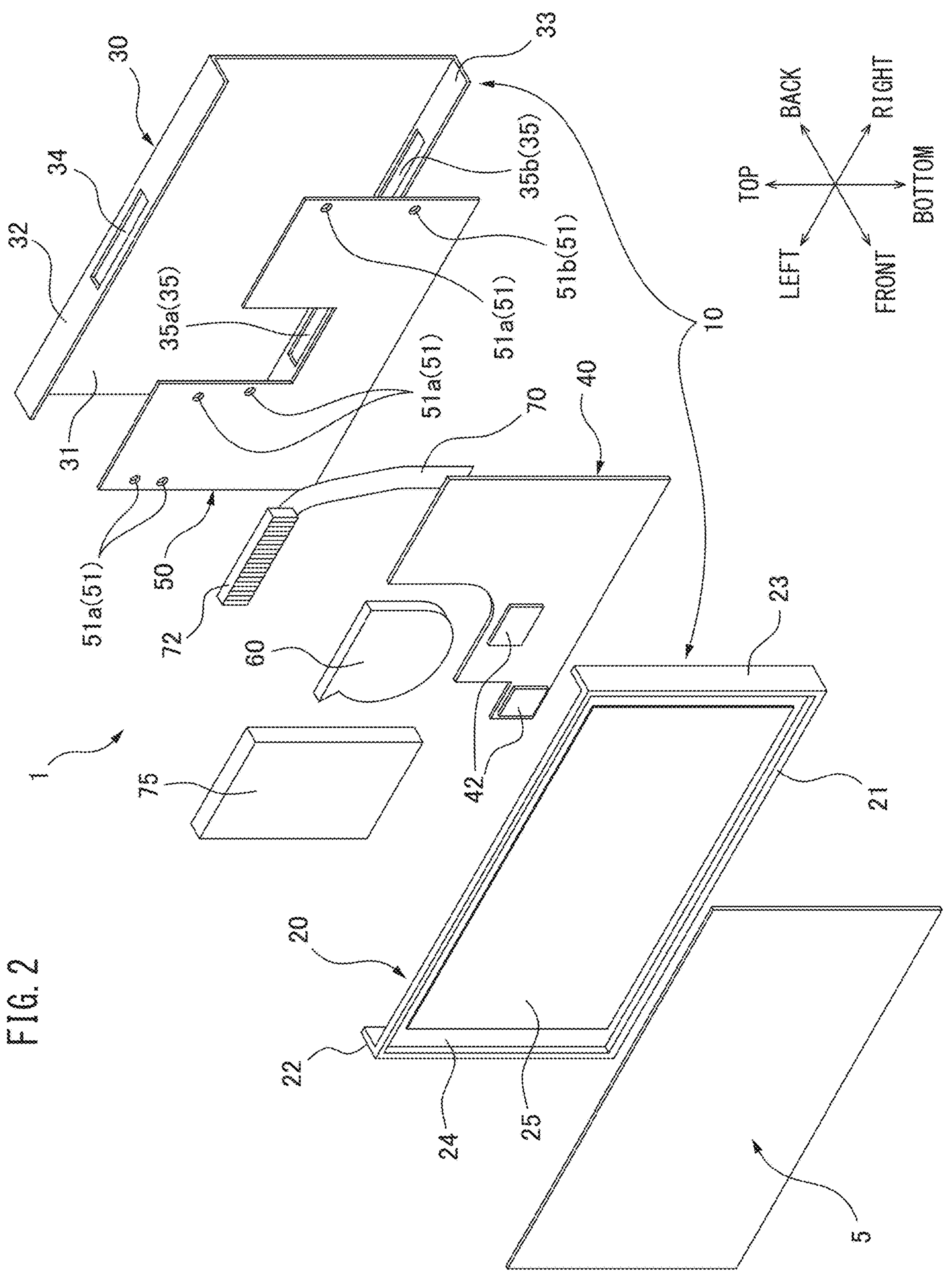
FIG. 2 is a schematic disassembled perspective view showing an electronic apparatus seen from the front top.

First, referring to FIGS. 1 and 2, the overall configuration of an electronic apparatus 1 according to one embodiment will be schematically explained. The electronic apparatus 1 is a substantially box-shaped apparatus provided with a display panel, and for example, is a portable game machine, tablet, mobile monitor, etc. In particular, in the present embodiment, the electronic apparatus 1 is a portable apparatus used in a state placed on a placement surface, such as a floor surface, or tabletop surface.

FIG. 1 is a schematic perspective view showing the electronic apparatus 1 seen from the front top. FIG. 2 is a schematic disassembled perspective view showing the electronic apparatus 1 seen from the front top. As shown in FIG. 1, the electronic apparatus 1 has a housing 10 formed in a substantially box-shape and a display panel 5 provided at one side surface side of the housing 10.

In this Description, a direction at which the display panel 5 is attached to the housing 10 is referred to as "front", and a direction at an opposite orientation to the front is referred to as "back". Therefore, the display panel 5 is provided at a front surface of the housing 10. Further, when the electronic apparatus 1 is set standing perpendicular to the placement surface at a normal orientation, the top direction, bottom direction, left direction, and right direction when viewing the electronic apparatus 1 from the front are respectively referred to as the "top", "bottom", "left", and "right" of the electronic apparatus 1 and its components. Further, the left-right direction of the electronic apparatus 1 is also referred to as the "lateral width direction".

As shown in FIG. 2, the electronic apparatus 1 has, in addition to the housing 10 and display panel 5, a board 40, back metal sheet 50, fan 60, heat pipe 70, heat sink 72, and battery 75. The board 40, back metal sheet 50, fan 60, heat pipe 70, heat sink 72, and battery 75 are housed in the housing 10.

Housing

Next, referring to FIGS. 1 to 3, the housing 10 will be explained. As shown in FIG. 1, the housing 10 has a front wall 11 positioned at a front side of the housing 10, a back wall 12 positioned at a back side of the housing 10, and a top wall 13, bottom wall 14, left wall 15, and right wall 16 positioned between the front wall 11 and the back wall 12. In particular, the top wall 13 is positioned at the top side of the housing 10, the bottom wall 14 is positioned at the bottom side of the housing 10, the left wall 15 is positioned at the left side of the housing 10, and the right wall 16 is positioned at the right side of the housing 10, respectively. In the present embodiment, the top wall 13, bottom wall 14, left wall 15, and right wall 16 extend perpendicular to the front wall 11 and the back wall 12. It should be noted that, "extend perpendicular" includes not only the walls extending strictly perpendicular, but also extending substantially perpendicular. Further, in the present embodiment, the front wall 11 and the back wall 12 are formed flat. In addition, in the present embodiment, the top wall 13, bottom wall 14, left wall 15, and right wall 16 are also formed flat.

As shown in FIG. 2, the housing 10 is mainly formed by two housing halves 20, 30. The front housing half 20 is arranged relatively at the front, while the back housing half 30 is arranged relatively at the back.

As shown in FIG. 2, in the present embodiment, the front housing half 20 mainly forms the front wall 11, left wall 15, and right wall 16 of the housing 10. Further, the back housing half 30 mainly forms the back wall 12, top wall 13, and bottom wall 14 of the housing 10. Therefore, if the back housing half 30 is attached to the front housing half 20, a housing 10 having the front wall 11, back wall 12, top wall 13, bottom wall 14, left wall 15, and right wall 16 is formed. It should be noted that, the top wall 13, bottom wall 14, left wall 15, and right wall 16 are respectively configured by either of the front housing half 20 and the back housing half 30. Therefore, the front housing half 20 may mainly form the front wall 11, top wall 13, and bottom wall 14, while the back housing half 30 may mainly form the back wall 12, left wall 15, and right wall 16. Alternatively, at least one of the top wall 13, bottom wall 14, left wall 15, and right wall 16 may be formed by both of the front housing half 20 and the back housing half 30 (for example, so that the two housing halves 20, 30 mate at the center in the front-back direction).

The front housing half 20 has a front main wall 21, left side wall 22, and right side wall 23. These respectively form the front wall 11, left wall 15, and right wall 16 of the housing 10. As shown in FIG. 2, the display panel 5 is provided at the front main wall 21. Further, the front main wall 21 extends in a direction perpendicular to the front-back direction. The left side wall 22 extends from the left side end part of the front main wall 21 toward the back. The right side wall 23 extends from the right side end part of the front main wall 21 toward the back. Further, the left side wall 22 and right side wall 23 extend over the entire length of the front main wall 21 in the top-bottom direction.

The front main wall 21 of the front housing half 20 has a sunken part 24 recessed toward the back at its front side. The sunken part 24 extends over the entire front surface of the front main wall 21 except at the outer circumference part of the front main wall 21. In particular, the sunken part 24 extends in the top-bottom direction and the lateral width direction over substantially the same lengths as the lengths of the display panel 5 in the top-bottom direction and the lateral width direction. Further, the sunken part 24 is formed so that its depth is slightly greater than the length of the display panel 5 in the front-back direction.

Further, at the front of the sunken part 24, a display heat conductive sheet 25 is arranged so as to contact the front main wall 21 (in particular, the later explained front metal sheet 28) at the sunken part 24. The display heat conductive sheet 25 is a sheet having thermal conductivity. As shown in FIG. 2, in the present embodiment, the display heat conductive sheet 25 is arranged over the entire sunken part 24. Further, the display panel 5 is fit into this sunken part 24. Therefore, the display heat conductive sheet 25 is arranged between the display panel 5 and the front main wall 21 (in particular, the later explained front metal sheet 28). Further, the display heat conductive sheet 25 contacts the back surface of the display panel 5. Therefore, the display heat conductive sheet 25 is arranged so as to contact the back surface of the display panel 5 and the front main wall 21 (in particular, the front metal sheet 28). By arranging the display heat conductive sheet 25 between the display panel 5 and the front metal sheet (second metal sheet) 28 in this way, the heat generated at the display panel 5 is able to be discharged to the front metal sheet 28 through the display heat conductive sheet.

It should be noted that, another component may be used instead of the display heat conductive sheet 25 as long as the component has thermal conductivity. Therefore, instead of the display heat conductive sheet 25, heat conductive grease may be used. Further, in the present embodiment, the display heat conductive sheet 25 or heat conductive grease contacts the back surface of the display panel 5, but a slight layer of air may be formed with the back surface of the display panel 5 without contact. Furthermore, in the present embodiment, the display heat conductive sheet 25 or heat conductive grease is arranged on the front main wall 21 at the sunken part 24, but it may be arranged at the back surface of the display panel 5. In this case, a slight layer of air may be formed between the display heat conductive sheet 25 or heat conductive grease provided at the back surface of the display panel 5 and the front main wall 21 at the sunken part 24.

Figure 3:
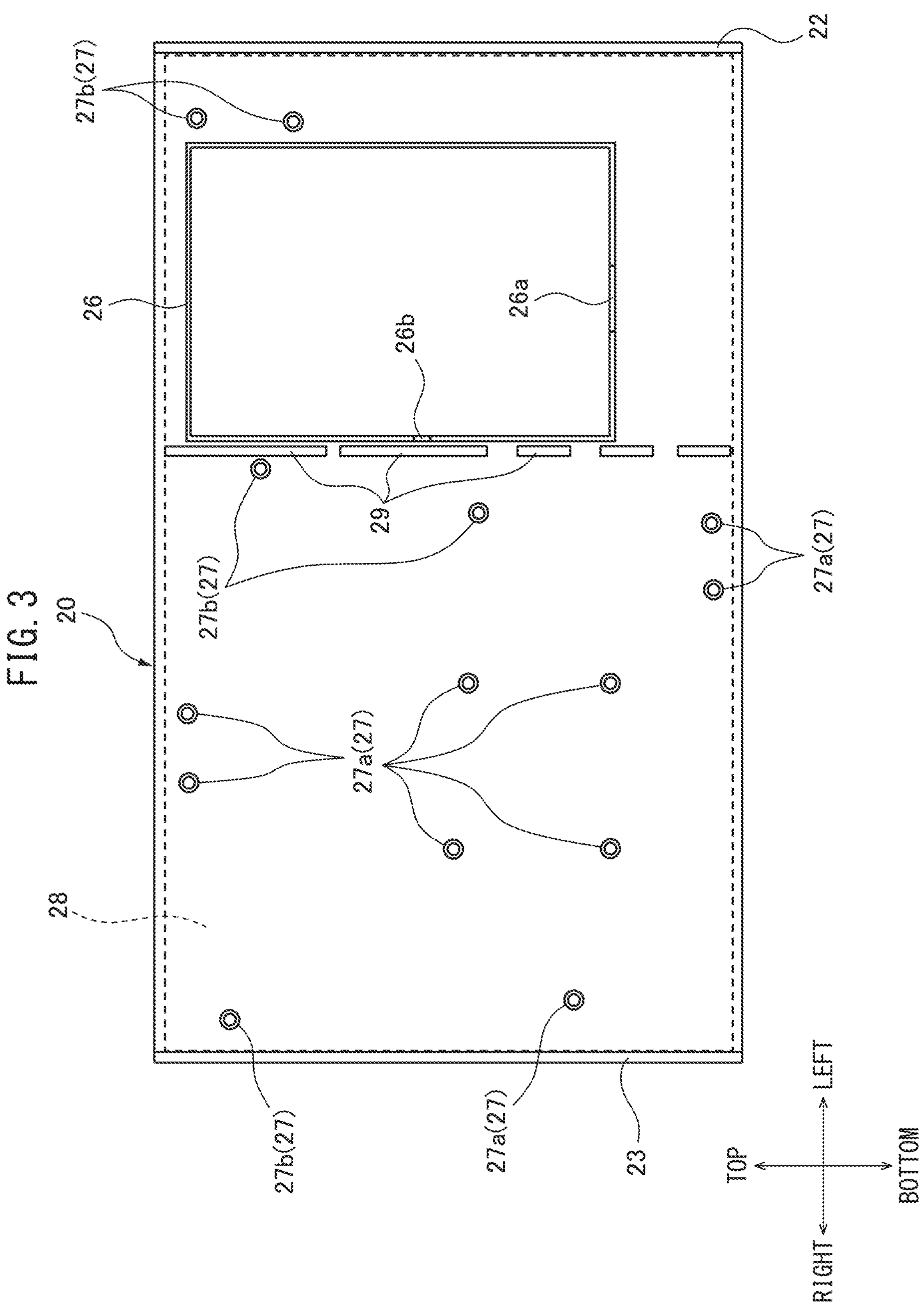
FIG. 3 is a plan view showing a front housing half seen from the back.

FIG. 3 is a plan view showing the front housing half 20 seen from the back. As shown in FIG. 3, the back surface of the front main wall 21 is provided with a frame part 26 for holding the battery 75 and a plurality of fastening holes 27.

The frame part 26 is an approximately rectangular wall extending from the back surface of the front main wall 21 toward the back. The frame part 26 is arranged so as to be slightly larger than the outer shape of the battery 75 so that the battery 75 can be arranged inside the frame part 26. Further, the frame part 26 has a height so that the back end part touches the back metal sheet (first metal sheet) 50. The frame part 26 has two cutaway parts **26*a*, 26*b*. The first cutaway part 26*a* is arranged at the bottom, while the second cutaway part 26*b* is arranged at the fan 60 side. At the regions where the cutaway parts 26*a*, 26*b* are provided, the frame part 26 has a height where the back end part does not reach the back metal sheet 50 so openings are formed between the back metal sheet 50 and the frame part 26. Therefore, air flows into and flows out from the region surrounded by the frame part 26, through the cutaway parts 26*a*, 26*b***.

The fastening holes 27 are configured to receive fasteners such as screws, and are used for attaching the board 40 or the back metal sheet 50 to the front main wall 21 (in particular, the front metal sheet 28). In the example shown in FIG. 3, the fastening holes 27 include a plurality of board fastening holes **27*a* used for receiving first fasteners 81 for attaching the board 40 (see FIG. 8), and a plurality of metal sheet fastening holes 27*b* used for receiving third fasteners 83 for attaching the back metal sheet 50**.

The front housing half 20 is formed by a plastic and metal. In particular, in the present embodiment, in the front housing half 20, the region at which the sunken part 24 is provided (the region positioned at the back of the sunken part 24) is formed as a metal sheet. Therefore, the part formed by metal in the front housing half 20 in this way will be referred to below as the "front metal sheet 28". Accordingly, part of the front main wall 21 in the front housing half 20 is formed by the front metal sheet 28. On the other hand, the part of the front housing half 20 other than the front metal sheet 28 (the remaining part of the front main wall 21, the left side wall 22, and the right side wall 23) is formed by a plastic member. Therefore, the front housing half 20 is formed by the front metal sheet 28 and the plastic member surrounding the perimeter of the front metal sheet 28 (top, bottom, left, and right) when viewed in the front-back direction. Further, in the present embodiment, the plastic member is formed so as to not substantially cover the front surface and back surface of the front metal sheet 28. Whatever the case, in the present embodiment, the front housing half 20 is formed of the front metal sheet 28 and the plastic member.

Further, the front metal sheet 28 of the front housing half 20 is formed by magnesium, aluminum, or another metal. The front metal sheet 28 has a plurality of openings (openings passing through the front metal sheet 28) 29 extending in the top-bottom direction along the frame part 26 at the center side from the frame part 26. The plurality of openings 29 are arranged so as to be aligned in one line in the top-bottom direction. In the present embodiment, the plurality of openings 29 are formed so as to extend over greater than or equal to half of the length of the front metal sheet 28 in the top-bottom direction. The plurality of openings 29 are filled with plastic. The thermal conductivity of the plastic is lower than the thermal conductivity of the metal forming the front metal sheet 28, therefore transfer of heat through the plurality of openings 29 is suppressed by the plurality of openings 29 and plastic formed in this way. As a result, transfer of heat from the region at the opposite side from the battery 75 with respect to the openings 29 to the region where the battery 75 is arranged is suppressed and accordingly unnecessary heating of the battery 75 is suppressed. For example, in the present embodiment, it is possible to suppress the heat from the SoC or other heat generating components from being transferred through the plastic filled in the openings 29 by arranging the SoC or other heat generating components at the right side and the battery 75 at the left side, in the left-right direction with respect to the openings 29 aligned in the top-bottom direction. It should be noted that, in the present embodiment, the front metal sheet 28 is provided with openings 29 passing through the front metal sheet 28, but instead of the openings 29, grooves not passing through the front metal sheet 28 may be provided.

It should be noted that, in the present embodiment, the region in the front housing half 20 corresponding to the sunken part 24 is formed by the metal of the front metal sheet 28. However, a region larger than the sunken part 24 or a region smaller than the sunken part 24 may be formed by the metal of the front metal sheet 28. Alternatively, the front housing half 20 as a whole may be formed by the metal as the front metal sheet 28. Therefore, at least part of the front housing half is formed by the front metal sheet 28. Further, in the present embodiment, the front metal sheet 28 forms part of the front housing half 20. However, the front metal sheet 28 may be a member separate from the front housing half 20. In this case, for example, the front housing half 20 as a whole is formed by plastic, and the front metal sheet 28 is attached to the back of the plastic front housing half 20. Further, the front housing half 20 may be constructed by other members in addition to the front metal sheet 28 and plastic member.

The back housing half 30 is formed by plastic, and has a back main wall 31, top side wall 32, and bottom side wall 33. These back main wall 31, top side wall 32, and bottom side wall 33 respectively form the back wall 12, top wall 13, and bottom wall 14 of the housing 10. The back main wall 31 extends in a direction perpendicular to the front-back direction. The top side wall 32 extends from the top end part of the back main wall 31 toward the front. The bottom side wall 33 extends from the bottom end part of the back main wall 31 toward the front. Further, the top side wall 32 and the bottom side wall 33 extend over the entire length of the back main wall 31 in the lateral width direction.

The top side wall 32 has one exhaust opening 34 at a position including the center in the lateral width direction. The exhaust opening 34 is an opening for exhausting air in the housing 10, in particular air flowing out from the fan 60, to the outside of the housing 10. The exhaust opening 34 passes through the top side wall 32 and extends in the lateral width direction. Further, in the present embodiment, the exhaust opening 34 is arranged at the center of the top side wall 32 in the front-back direction. It should be noted that, in the present embodiment, the exhaust opening 34 is formed as a single opening, but it may be formed as a plurality of openings. In this case, the exhaust opening 34, for example, may be formed by a plurality of openings arranged in a line in the lateral width direction. Further, the exhaust opening 34 may be provided with a mesh-like member or the like so that foreign matter does not enter into the housing 10 through the exhaust opening 34.

The bottom side wall 33 has two intake openings 35 respectively arranged at the either side with respect to the center in the lateral width direction. The intake openings 35 are openings for intake of air outside of the housing 10 to inside the housing 10. The left side intake opening (second intake opening) 35*a* is arranged at the left side from the center of the bottom side wall 33, while the right side intake opening (first intake opening) 35*b* is arranged at the right side from the center of the bottom side wall 33. The intake openings 35 pass through the bottom side wall 33 and extend in the lateral width direction. Further, in the present embodiment, the intake openings 35 are arranged at the center of the bottom side wall 33 in the front-back direction. Further, the two intake openings 35 are arranged at the same positions as each other in the front-back direction. It should be noted that, in the present embodiment, the left side intake opening 35*a* and the right side intake opening 35*b* are respectively formed as single openings, but they may respectively be formed by pluralities of openings. In this case, the intake openings 35 may be formed as pluralities of openings arranged in lines in, for example, the lateral width direction. Further, the intake openings 35 may be provided with mesh-like members or the like so that foreign matter does not enter the housing 10 through the intake openings 35. Further, in addition to the two intake openings 35 respectively arranged at the either side from the center or instead of these intake openings 35, an intake opening 35 may be provided at a position including the center of the bottom side wall 33 in the lateral width direction.

It should be noted that, in the present embodiment, the intake openings 35 are provided at the bottom side wall 33 (i.e., the bottom wall 14 of the housing 10). However, the intake openings 35 may be provided at other side walls (for example, the top side wall 32, left side wall 22, and right side wall 23 respectively forming the top wall 13, left wall 15, and right wall 16 of the housing 10). That is, the plurality of intake openings 35 need only be arranged separated from each other at the same surface of the housing 10. Further, the plurality of intake openings 35 are provided at the bottom side wall 33, i.e. at the same side wall (i.e., the bottom wall 14, which is the same side wall of the housing 10). However, the plurality of intake openings 35 may be provided at different side walls, for example, the left side wall 22 and the right side wall 23 respectively forming the left wall 15 and the right wall 16 of the housing 10. Whatever the case, the plurality of intake openings 35 are arranged separated from each other so as to be positioned at directions different from each other with respect to the fan 60.

Display Panel

As shown in FIGS. 1 and 2, the display panel 5 is arranged at the front main wall 21 of the front housing half 20. In the present embodiment, the display panel 5 is arranged over substantially the entire surface of the front main wall 21, and has a flat surface. The display panel is one example of an apparatus for displaying still images or moving images in accordance with a signal output from a video control electronic component (not shown) provided in the electronic apparatus 1. The display panel 5, for example, is a liquid crystal display panel, EL (electroluminescence) display panel, or plasma display panel. The display panel 5 may be provided on its surface with a touch panel functioning as an input device.

Board

Figure 4:
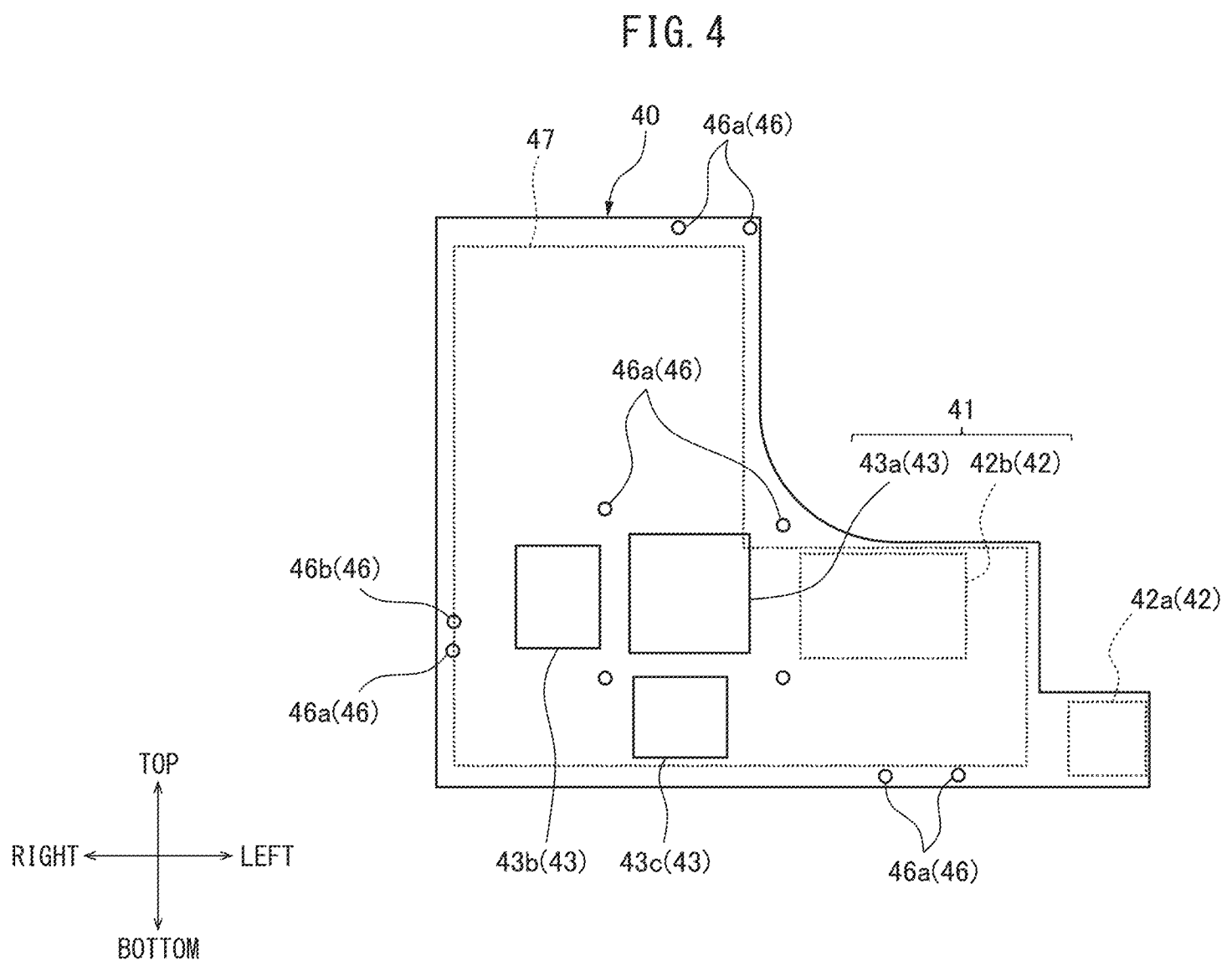
Figure 5:
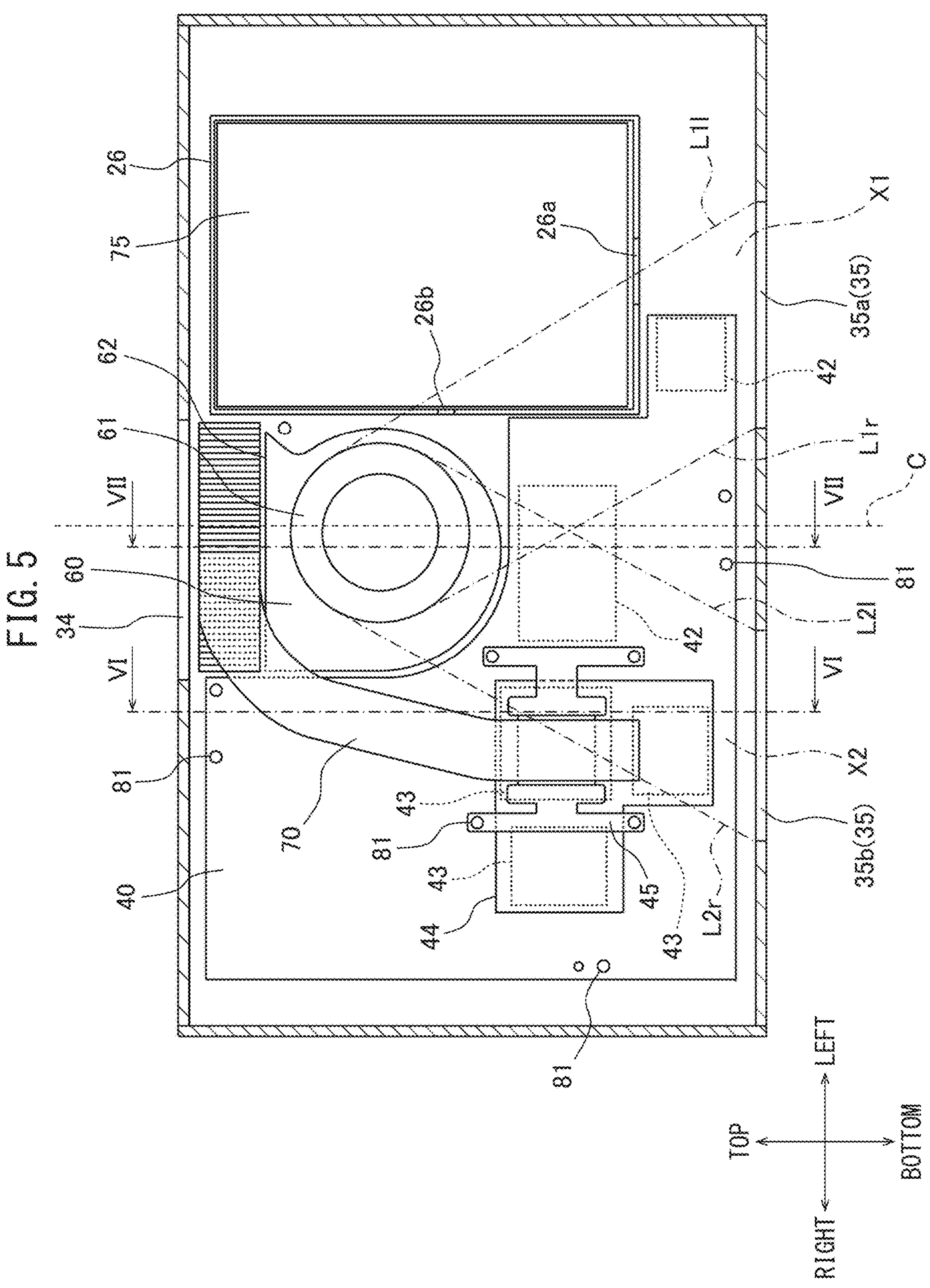
FIG. 5 is a plan view showing an electronic apparatus seen from the back, in the state where a back housing half and a back metal sheet are detached.
Figure 6:
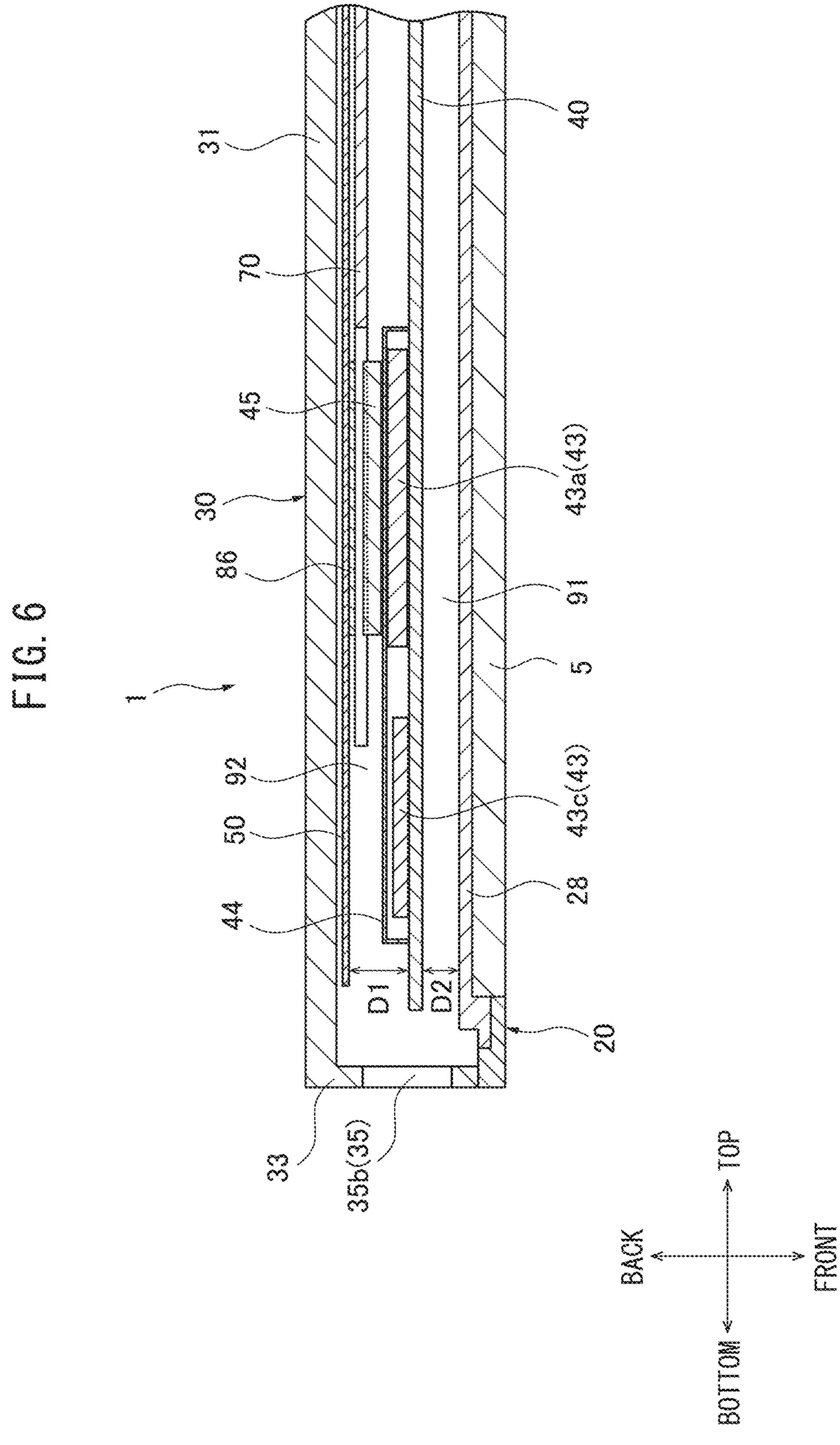
FIG. 6 is a partial cross-sectional view of an electronic apparatus seen along the line VI-VI of FIG. 5.

Next, referring to FIGS. 2 and 4 to 6, the board 40 will be explained. The board 40 is one example of a member for mounting electronic components for realizing various functions of the electronic apparatus 1. FIG. 4 is a plan view showing the board 40 seen from the back. FIG. 5 is a plan view showing the electronic apparatus 1 seen from the back in the state where the back housing half 30 and the back metal sheet 50 are detached (only side walls seen in cross-section). Further, FIG. 6 is a partial cross-sectional view of the electronic apparatus 1 seen along the line 15 VI-VI of FIG. 5.

The board 40 is arranged between the front main wall 21 and the back main wall 31 in the front-back direction, and extends in a direction perpendicular to the front-back direction. As shown in FIG. 5, the board 40 has a shape not overlapping the fan 60 when viewed in the front-back direction. In particular, in the present embodiment, as shown in FIGS. 2, 4, and 5, the board 40 has an L shape. Further, as shown in FIG. 5, the board 40 is arranged so as to be positioned at the both sides of the center line C of the electronic apparatus 1 in the lateral width direction. In particular, in the present embodiment, the board 40 is arranged so that the majority of it is positioned at the right side of the center line C of the electronic apparatus 1 in the lateral width direction. Further, in the present embodiment, the board 40 is arranged so as to be positioned in the spaces between the intake openings 35 and inflow openings 61 of the fan 60 when viewed in the front-back direction. Specifically, the board 40 is positioned in the space X1 between the line L1l connecting the left end of the left side intake opening 35*a* and the left end of the inflow openings 61 of the fan 60 and the line L1*r* connecting the right end of the left side intake opening 35*a* and the right end of the inflow openings 61 of the fan 60, in FIG. 5. In addition, the board 40 is positioned in the space X2 between the line L2l connecting the left end of the right side intake opening 35*b* and the left end of the inflow openings 61 of the fan 60 and the line L2*r* connecting the right end of the right side intake opening 35*b* and the right end of the inflow openings 61 of the fan 60, in FIG. 5. It should be noted that, the board 40 may be arranged in any way so long as arranged so as to be positioned in the spaces (X1, X2) between the plurality of intake openings 35 and the inflow openings 61 of the fan 60. Therefore, the board 40 may be arranged so as to be positioned at only one side of the center line C of the electronic apparatus 1 in the lateral width direction.

Further, as shown in FIGS. 4 and 5, a plurality of electronic components 41 and a shield member 44 covering a part of the electronic components 41 are attached to the board 40. Further, the board 40 has a plurality of board openings 46 and a ground pattern 47 on the board.

The electronic components 41 are examples of the electronic components mounted on the board 40 for realizing respectively different functions, and are heat generating components generating heat at the time of operation. The electronic components 41 include at least one front side electronic component (second heat generating component) 42 mounted on the front surface of the board 40 (second surface) and at least one back side electronic component (first heat generating component) 43 mounted on the back surface of the board 40 (surface at opposite side to front surface, first surface). In the example shown in FIGS. 4 and 5, two front side electronic components 42 are mounted at the front surface of the board 40 and three back side electronic components 43 are mounted at the back surface of the board 40. Some or all of the front side electronic components 42 are arranged so as to at least partially overlap the front metal sheet 28 at the front-back direction. Some or all of the back side electronic components 43 are arranged so as to at least partially overlap the back metal sheet 50 in the front-back direction. Further, the front side electronic components 42 and the back side electronic components 43 are arranged so as not to overlap each other in the front-back direction.

In the example shown in FIGS. 4 and 5, the front side electronic components 42 include a first front side electronic component 42*a* provided at the bottom left end of the board 40, and a second front side electronic component 42*b* provided leftward around the center of the board 40. Therefore, the first front side electronic component 42*a* and the second front side electronic component 42*b* are arranged relatively leftward. As a result, the first front side electronic component 42*a* and the second front side electronic component 42*b* are respectively arranged at least in part in the space X1 between the left side intake opening 35*a* and the inflow openings 61 of the fan 60. In particular, in the present embodiment, the second front side electronic component 42*b* is larger in average amount of heat generated or maximum amount of heat generated than the first front side electronic component 42*a*. Therefore, the front side electronic component 42 with the largest average amount of heat generated or the largest maximum amount of heat generated among the front side electronic components 42 provided at the front side of the board 40 is at least partially positioned in the space X1 between the left side intake opening 35*a* and the inflow openings 61 of the fan 60.

Further, in the present embodiment, the first front side electronic component 42*a* is a component including a memory or storage IC enabling information to be rewritten, while the second front side electronic component 42*b* is a component not including a memory and storage IC enabling information to be rewritten. Therefore, the first front side electronic component 42*a* is a component weaker against heat compared with the second front side electronic component 42*b*.

It should be noted that, the front side of the board 40 may be provided with just a single front side electronic component 42 or may be provided with three or more front side electronic components 42 as well. Further, some or all of the front side electronic components 42 may be arranged relatively rightward on the board 40. Furthermore, some or all of the front side electronic components 42 may be arranged in the space X1 between the left side intake opening 35*a* and the inflow openings 61 of the fan 60. None need be positioned in the space X1 either. In particular, if the front side electronic components 42 are, for example, arranged to be able to transfer heat with the shield member or other members, if at least a part of these members are positioned in the space X1, the front side electronic components 42 need not be positioned in the space X1. Further, the front side electronic component 42 with the largest average amount of heat generated or the largest maximum amount of heat generated among the front side electronic components 42 need not be positioned in the space X1 between the left side intake opening 35*a* and the inflow openings 61 of the fan 60.

Further, in the example shown in FIGS. 4 and 5, the back side electronic components 43 include a first back side electronic component 43*a* provided rightward around the center of the board 40, a second back side electronic component 43*b* provided at the right side of the first back side electronic component 43*a*, and a third back side electronic component 43*c* provided at the bottom side of the first back side electronic component 43*a*. Therefore, the first back side electronic component 43*a*, second back side electronic component 43*b*, and third back side electronic component 43*c* are arranged relatively rightward. As a result, the first back side electronic component 43*a* and third back side electronic component 43*c* are respectively positioned at least in part in the space X2 between the right side intake opening 35*b* and the inflow openings 61 of the fan 60.

In particular, in the present embodiment, the first back side electronic component 43*a* has an average amount of heat generated or maximum amount of heat generated larger than the second back side electronic component 43*b* and the third back side electronic component 43*c*. Therefore, the back side electronic component 43 with the largest average amount of heat generated or the largest maximum amount of heat generated among the back side electronic components 43 provided at the back side of the board 40 is at least partially positioned in the space X2 between the right side intake opening 35*b* and the inflow openings 61 of the fan 60.

It should be noted that, the back side of the board 40 may be provided with just a single back side electronic component 43 or may be provided with two or greater than or equal to four back side electronic components 43. Further, some or all of the back side electronic components 43 may be arranged relatively leftward on the board 40. Furthermore, some or all of the back side electronic components 43 may be positioned in the space X2 between the right side intake opening 35*b* and the inflow openings 61 of the fan 60 or none of the back side electronic components 43 may be positioned in the space X2. In particular, if the back side electronic components 43 are, for example, arranged to be able to transfer heat with a member such as the shield member 44, as long as at least a part of the member are positioned in the space X2, the back side electronic components 43 may not be positioned in the space X2. Further, the back side electronic component 43 with the largest average amount of heat generated or the largest maximum amount of heat generated among the back side electronic components 43 may not be positioned in the space X2 between the right side intake opening 35*b* and the inflow openings 61 of the fan 60.

Further, in the present embodiment, the total amount of heat generated of all of the back side electronic components 43 is larger than the total amount of heat generated of all of the front side electronic components 42. In addition, in the present embodiment, the average amount of heat generated or maximum amount of heat generated of a component with a large average amount of heat generated or maximum amount of heat generated (first back side electronic component 43*a*) among the back side electronic components 43 is larger than the average amount of heat generated or maximum amount of heat generated of a component with a large average amount of heat generated or maximum amounts of heat generated (second front side electronic component 42*b*) among the front side electronic components 42.

The shield member 44 is one example of a member used for blocking noise emitted from the electronic components 41, and is formed by a metal having thermal conductivity. In the present embodiment, the shield member 44, as shown in FIGS. 5 and 6, is arranged so as to cover all of the three back side electronic components 43. Further, in the present embodiment, the shield member 44 is attached to the board 40 so as to contact the back surface of the first back side electronic component 43*a* and, further, to be separated from the back surfaces of the second back side electronic component 43*b* and the third back side electronic component 43*c*. It should be noted that, the shield member 44 may be attached to the board 40 so as to contact the back surface of at least one or all of the first back side electronic component 43*a*, second back side electronic component 43*b*, and third back side electronic component 43*c* through thermal conductive grease. By this configuration, even when the heights of electronic components differ from each other, the first to third back side electronic components and shield member 44 can be connected to be able to transfer heat.

It should be noted that, in the present embodiment, the shield member 44 is provided so as to cover the three back side electronic components 43. However, the shield member 44 may be provided so as to cover only a part of the three back side electronic components 43. Further, in the present embodiment, one shield member 44 is provided so as to cover the three back side electronic components 43. However, the board 40 may be provided with a plurality of shield members 44. Each may be arranged to cover one or more of the back side electronic components 43. Further, a part of the plurality of the shield members 44 may be provided so as to cover the front side electronic components 42. Further, the shield member 44 is attached to the board 40 so as to contact the back surface of the first back side electronic component 43*a*, but in addition to the first back side electronic component 43*a* or in place of the first back side electronic component 43*a*, it may be attached to the board 40 so as to contact the back surface of the second back side electronic component 43*b* and/or the third back side electronic component 43*c*. In addition, the shield member 44 may be attached to the board 40 so as to contact the front surfaces of the front side electronic components 42 and other electronic components. Further, the shield member 44 may be formed to have an opening so that a part of the electronic components 41 covered by the shield member 44 are exposed to the outside of the shield member 44.

In the present embodiment, the shield member 44 is attached to the board 40 by metal mounting hardware 45 having thermal conductivity. As shown in FIGS. 5 and 6, the mounting hardware 45 is arranged contacting the shield member 44 at the back of the shield member 44, and is fastened to the board 40 and the front housing half 20 by first fasteners 81 for attaching the board 40 to the front housing half 20 (in particular, the front metal sheet 28). If an opening is formed in the shield member 44, the mounting hardware 45 may be arranged so as to cover that opening. In this case, the mounting hardware 45 is used for blocking noise emitted from the electronic components 41 positioned in the shield member 44. Further, in this case, the mounting hardware 45 may be arranged so as to contact the back surface of the electronic components 41 positioned in the opening of the shield member 44. It should be noted that, the mounting hardware 45 may be formed by a material other than metal as long as having thermal conductivity.

The board openings 46 are openings for insertion of the first fasteners 81 for attaching the board 40 to the front housing half 20 (in particular, the front metal sheet 28) or second fasteners 82 for attaching the back metal sheet 50 to the board 40. As will be understood from FIGS. 3 and 4, the first board openings 46*a* for insertion of the first fasteners 81 for attaching the board 40 to the front metal sheet 28 are arranged at positions corresponding to the board fastening holes 27*a* of the front housing half 20. In addition, the second board openings 46*b* for insertion of the second fasteners 82 for attaching the back metal sheet 50 to the board 40 are arranged at positions corresponding to the metal sheet openings 51 provided at the back metal sheet 50. As shown in FIG. 4, the number of the first board openings 46*a* is greater than the number of the second board openings 46*b*. In particular, in the present embodiment, the board 40 is provided with only one second board opening 46*b*.

The ground pattern 47 is an interconnect pattern electrically connected to a ground potential of the electronic apparatus 1. The ground pattern 47, as shown in FIG. 4, is arranged so as to extend over the entirety of the board 40 except for the proximity of the first front side electronic component 42*a*. Therefore, the ground pattern 47 is arranged so as to overlap at least a part of the electronic components 41 when viewed in the front-back direction. In particular, in the present embodiment, the ground pattern 47 is arranged so that all of the front side electronic components 42 other than the first front side electronic component 42*a* overlap the ground pattern 47 when viewed in the front-back direction. Further, in the present embodiment, the ground pattern 47 is arranged so that all of the back side electronic components 43 overlap the ground pattern 47 when viewed in the front-back direction. It should be noted that, the ground pattern 47 may be arranged so that all of the front side electronic components 42 overlap the ground pattern 47 when viewed in the front-back direction or may be arranged so that a part of the back side electronic components 43 do not overlap the ground pattern 47. Further, it may be arranged so that none of the front side electronic components 42 and/or none of the back side electronic components 43 overlap the ground pattern 47.

The ground pattern 47 is formed of copper, silver, or another conductor, and is formed by a general processing method for providing interconnect patterns on a printed circuit board (for example, etching etc.) In the present embodiment, the board 40 is formed to have a plurality of layers, and the ground pattern 47 is arranged on one layer among these.

In the present embodiment, the ground pattern 47 is electrically connected to the inside surfaces of at least a part of the board openings 46. In particular, in the present embodiment, the ground pattern 47 is electrically connected to the inside surfaces of at least a part of the first board openings 46*a*. As a result, the ground pattern 47 is electrically connected to the front metal sheet 28 through the first fasteners 81 inserted in the first board openings 46*a*. Therefore, the front metal sheet 28 is electrically connected to the ground potential through the first fasteners 81. Further, in the present embodiment, the ground pattern 47 is electrically connected to the inside surface of the second board opening 46*b* (when there are a plurality of the second board openings 46*b*, the inside surfaces of at least a part of the second board openings 46*b*). As a result, the ground pattern 47 is electrically connected to the back metal sheet 50 through the second fastener 82 inserted in the second board opening 46*b*. Therefore, the back metal sheet 50 is electrically connected to the ground potential through the second fastener 82.

Further, the ground pattern 47 is connected to the inside surfaces of at least a part of the board openings 46 to be able to transfer heat. In particular, the ground pattern 47 is connected to the inside surfaces of at least a part of the first board openings 46*a* to be able to transfer heat. As a result, the ground pattern 47 is connected to the front metal sheet 28 to be able to transfer heat through the first fasteners 81 inserted into the first board openings 46*a*. Further, the ground pattern 47 is connected to the inside surface of the second board opening 46*b* (when there are a plurality of the second board openings 46*b*, the inside surfaces of at least a part of the second board openings 46*b*) to be able to transfer heat. As a result, the ground pattern 47 is connected to the back metal sheet 50 to be able to transfer heat through the second fastener 82 inserted into the second board opening 46*b*.

Further, in the present embodiment, the ground pattern 47 is electrically connected to be able to transfer heat with all of the electronic components 41 or a part of the electronic components 41 provided at the board 40. Specifically, the ground pattern 47 extends up to the proximity of these electronic components 41 so as to contact a part of terminals of all of the electronic components 41 or a part of terminals of a part of the electronic components 41 provided on the board 40.

It should be noted that, in the present embodiment, both of the first board openings 46*a* and the second board opening 46*b* are connected to the same ground pattern 47, while the front side electronic components 42 and the back side electronic components 43 are both connected to the same ground pattern 47. However, the board 40 may have a plurality of the ground patterns. In this case, the first board openings 46*a* and the second board opening 46*b* may be electrically connected to mutually different ground patterns to be able to transfer heat, and the front side electronic components 42 and the back side electronic components 43 may be electrically connected to mutually different ground patterns to be able to transfer heat. In this case, at least a part of the front side electronic components 24 are arranged to overlap the ground pattern connected to the front side electronic components 42 when viewed in the front-back direction. In addition, at least a part of the back side electronic components 43 are arranged to overlap the ground pattern connected to the back side electronic components 43 when viewed in the front-back direction.

Furthermore, the board 40 may have one or more interconnect patterns different from the ground pattern 47 (not electrically connected to the ground potential of the electronic apparatus 1). In this case, the first board openings 46*a* and/or the second board opening 46*b* may be connected to an interconnect pattern different from the ground pattern 47, in addition to the ground pattern 47 or in place of the ground pattern 47. At this time, the first board openings 46*a* and the second board opening 46*b* may be connected to the same interconnect patterns different from the ground pattern 47 or may be connected to separate interconnect patterns different from the ground pattern 47. Summarizing the above, the front metal sheet 28 may be electrically connected to a second interconnect pattern of the board 40 to be able to transfer heat through the first board openings 46*a* and the first fasteners 81 inserted through the first board openings 46*a*, while the back metal sheet 50 may be electrically connected to the first interconnect pattern of the board 40 to be able to transfer heat through the second board opening 46*b* and the second fastener 82 inserted through the second board opening 46*b*. Further, the first interconnect pattern and second interconnect pattern may be the same interconnect patterns, or may be mutually different interconnect patterns. Further, the first interconnect pattern and second interconnect pattern may be ground patterns electrically connected to the ground potential of the electronic apparatus 1 or may be interconnect patterns different from a ground pattern.

Similarly, the front side electronic components 42 and the back side electronic components 43 may be connected to interconnect patterns different from the ground pattern 47, in addition to the ground pattern 47 or in place of the ground pattern 47. At this time, the front side electronic components 42 and the back side electronic components 43 may be connected to the same interconnect patterns different from the ground pattern 47, or may be connected to separate interconnect patterns different from the ground pattern 47. Summarizing the above, the front side electronic components 42 may be electrically connected to the first interconnect pattern of the board 40 to be able to transfer heat, while the back side electronic components 43 may be electrically connected to the second interconnect pattern of the board 40 to be able to transfer heat. Further, the first interconnect pattern and second interconnect pattern may be the same interconnect patterns, or may be mutually different interconnect patterns. Further, the first interconnect pattern and second interconnect pattern may be ground patterns electrically connected to the ground potential of the electronic apparatus 1 or may be interconnect patterns different from a ground pattern.

It should be noted that, in the present embodiment, the ground pattern 47 is formed by a general processing method, but the ground pattern 47 or other interconnect patterns connected to the first board openings 46*a* and/or the second board opening 46*b* may be an interconnect pattern formed as a membrane sheet fixed to the board formed as a plastic frame. Alternatively, the ground pattern 47 or other interconnect patterns connected to the first board openings 46*a* and/or the second board opening 46*b* may be an interconnect pattern formed by electroconductive ink printed between two plastic films (for example, polyester sheets).

Further, in the present embodiment, as shown in FIG. 4, the ground pattern 47 is not provided around the first front side electronic component 42*a*. In addition, an interconnect pattern other than an interconnect pattern for connecting to the first front side electronic component 42*a* is not provided around the first front side electronic component 42*a*. Due to this, transfer of heat to the heat susceptible first front side electronic component 42*a* through an interconnect pattern provided at the board 40 is suppressed, and thus the first front side electronic component 42*a* is kept from malfunctioning due to heat. In particular, in the present embodiment, the first front side electronic component 42*a* is a component including a rewritable memory or storage IC and malfunctions in rewriting or the like due to heat become harder to occur.

Further, the board 40 may have a metal pattern different from the ground pattern 47 and interconnect pattern other than the ground pattern 47. Such a metal pattern is connected to the inside surface of at least one of the first board openings 46*a* and the second board opening 46*b* to be able to transfer heat. Such a metal pattern is not connected to the ground pattern 47 and interconnect pattern other than the ground pattern 47 even if the board 40 has the ground pattern 47 and interconnect pattern other than the ground pattern 47. Due to such a metal pattern, the heat of the board 40 can be made to be transferred to at least one of the front metal sheet 28 and the back metal sheet 50.

Back Metal Sheet

Figure 7:
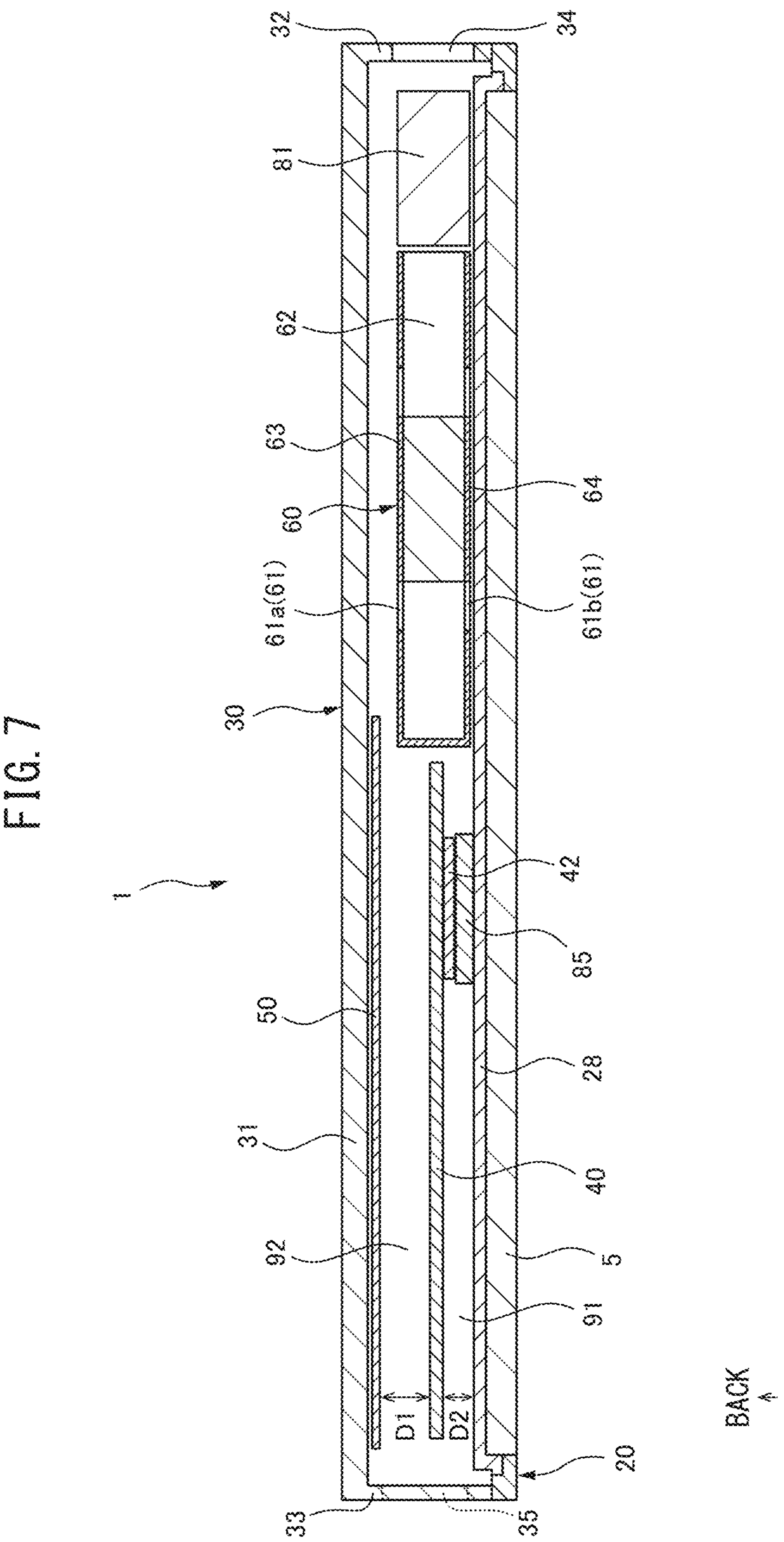
FIG. 7 is a cross-sectional view of an electronic apparatus seen along the line VII-VII of FIG. 5.

Next, referring to FIGS. 2, 6 and 7, the back metal sheet 50 will be explained. FIG. 7 is a cross-sectional view of the electronic apparatus 1 viewed along the line VII-VII of FIG. 5. The back metal sheet 50 is one example of a member at the back of the board 40 used for dissipating heat generated by the electronic components 41. As shown in FIG. 2, the back metal sheet 50 is formed into a sheet shape.

The back metal sheet 50 is formed by magnesium, aluminum, or another metal. In particular, in the present embodiment, the back metal sheet 50 is formed by a material having a higher thermal conductivity and larger specific gravity than the front metal sheet 28. Therefore, for example, the front metal sheet 28 is formed by magnesium and the back metal sheet 50 is formed by aluminum. Further, in the present embodiment, the back metal sheet 50 is smaller in area than the front metal sheet 28 when viewed in the front-back direction.

As shown in FIG. 2, the back metal sheet 50 has a shape not overlapping the fan 60 much at all when viewed in the front-back direction. In the present embodiment, the back metal sheet 50 is arranged to overlap the board 40 and the battery 75 when viewed in the front-back direction. In particular, in the present embodiment, the back metal sheet 50 is formed in a U-shape so as to surround the fan 60 when viewed in the front-back direction. Further, in the present embodiment, the back metal sheet 50 is arranged to be positioned in the spaces X1, X2 between the intake openings 35 and the inflow openings 61 of the fan 60 when viewed in the front-back direction. Specifically, the back metal sheet 50 is positioned in the space X1 between the left side intake opening 35*a* and the inflow openings 61 of the fan 60 and is positioned in the space X2 between the right side intake opening 35*b* and the inflow openings 61 of the fan 60.

It should be noted that, the back metal sheet 50 may be partially positioned in the space X1 between the left side intake opening 35*a* and the inflow openings 61 of the fan 60. Similarly, the back metal sheet 50 may be partially positioned in the space X2 between the right side intake opening 35*b* and the inflow openings 61 of the fan 60.

The back metal sheet 50 has a plurality of metal sheet openings 51. The metal sheet openings 51 are openings for insertion of the third fasteners 83 for attaching the back metal sheet 50 to the front housing half 20 (in particular, the front metal sheet 28) or the second fastener 82 for attaching the back metal sheet 50 to the board 40. As will be understood from FIGS. 2 and 4, the first metal sheet openings 51*a* for insertion of the third fasteners 83 for attaching the back metal sheet 50 to the front housing half 20 are arranged at positions corresponding to the metal sheet fastening holes 27*b* of the front housing half 20. In addition, the second metal sheet opening 51*b* for insertion of the second fastener 82 for attaching the back metal sheet 50 to the board 40 is arranged at a position corresponding to the second board opening 46*b* provided at the board 40. As shown in FIG. 2, the number of the first metal sheet openings 51*a* is greater than the number of the second metal sheet openings 51*b*. In particular, in the present embodiment, the back metal sheet 50 is provided with just one second metal sheet opening 51*b*.

It should be noted that, in the present embodiment, the back metal sheet 50 is formed as a member separate from the back housing half 30. However, the back metal sheet 50 may be formed as the back main wall 31 of the back housing half 30 or part of the same. In this case, the back metal sheet 50 is, for example, formed as part of the back housing half 30 so as to be exposed at the front surface of the integrally formed back housing half 30. Therefore, at least part of the housing 10 is formed by the front metal sheet 28 or the back metal sheet 50.

Fan

Next, referring to FIGS. 2 and 7, the fan 60 will be explained. The fan 60 is a device which takes in air from the inflow openings 61 and exhausts the air taken in from the outflow opening 62. In the present embodiment, the fan 60 is attached to the front housing half 20 at the back of the front housing half 20 (in particular, the front metal sheet 28). In particular, in the present embodiment, the fan 60 is attached so that a clearance is formed between the back surface of the front housing half 20 and the front surface of the fan 60. Further, the fan 60 is arranged so as to be positioned at the center top of the housing when viewed in the front-back direction. The fan 60 has inflow openings 61 provided at the front surface and back surface and an outflow opening 62 provided top.

The inflow openings 61 include a first inflow opening 61*a* provided at the back surface side and a second inflow opening 61*b* provided at the front surface side. In the present embodiment, as shown in FIGS. 2 and 7, the first inflow opening 61*a* and second inflow opening 61*b* are both formed into ring shapes of the same forms. It should be noted that, the fan 60 may have inflow openings 61 only at the back surface side. Alternatively, the fan 60 may have inflow openings provided bottom, leftward, and/or rightward of the fan 60 in addition to or in place of the first inflow opening 61*a* and/or second inflow opening 61*b*.

A single outflow opening 62 is provided at the top of the fan 60. The outflow opening 62 is arranged so as to face the exhaust opening 34 of the back housing half 30. It should be noted that, as long as the outflow opening 62 is arranged so as to face the exhaust opening 34 of the housing 10, it may be arranged in any direction of the fan 60. For example, if the exhaust opening 34 of the housing 10 is formed at the left wall 15 or the right wall 16 of the housing 10 (the left side wall 22 or the right side wall 23 of the front housing half 20), the fan 60 is arranged so that the outflow opening 62 faces the lateral width direction.

When the fan 60 configured in this way is driven, air is sucked from the outside of the electronic apparatus 1 into the respective intake openings 35 of the back housing half 30. Further, the air sucked into the intake openings 35 passes through the inside of the housing 10 and is taken in from the inflow openings 61 of the fan 60 to the fan 60. At this time, the air sucked in from the left side intake opening 35*a* mainly flows through the space X1 between the left side intake opening 35*a* and the inflow openings 61 of the fan 60. Similarly, the air sucked in from the right side intake opening 35*b* mainly flows through the space X2 between the right side intake opening 35*b* and the inflow openings 61 of the fan 60. The air taken into the fan 60 is exhausted from the fan 60 through the outflow opening 62, while the exhausted air flows upward in the housing 10 and flows out from the exhaust opening 34 of the back housing half 30 to the outside of the electronic apparatus 1. In the present embodiment, a heat sink 72 is arranged between the outflow opening 62 of the fan 60 and the exhaust opening 34, therefore the air flowing out from the outflow opening 62 of the fan 60 flows through the heat sink 72, then flows out from the exhaust opening 34 to the outside of the electronic apparatus 1.

Other Components

Next, referring to FIGS. 2 and 5 to 8, a heat pipe 70, heat sink 72, battery 75, and fasteners 81 to 83 will be explained.

The heat pipe 70 is one example of a member transferring heat generated at the back side electronic components 43 to the heat sink 72. The heat pipe 70 is formed of a pipe of meal having thermal conductivity, such as copper, or aluminum, in which a liquid is enclosed. As shown in FIGS. 5 and 6, one end of the heat pipe 70 is arranged at the back of the mounting hardware 45 so as to contact the mounting hardware 45. Therefore, one part of the heat generated of the back side electronic components 43 is transferred to the heat pipe 70 through the shield member 44 and the mounting hardware 45. Further, the other end of the heat pipe 70 is connected to the heat sink 72 to be able to transfer heat. Therefore, the heat transferred through the heat pipe 70 is transferred to the heat sink 72.

It should be noted that, as long as the heat generated at the back side electronic components 43 can be transferred to the heat sink 72, a member other than a heat pipe 70 may be used. Therefore, for example, instead of the heat pipe 70, a vapor chamber or the like may be used. Further, the heat pipe 70 may be arranged so as not to contact the mounting hardware 45, but directly to the shield member 44 or the back side electronic components 43. Whatever the case, as long as configured so that the heat of the back side electronic components 43, in particular the back side electronic component 43 with the largest average amount of heat generated or the largest maximum amount of heat generated among the back side electronic components 43, is transferred to the heat pipe 70, the heat pipe 70 may be arranged in any way.

The heat sink 72 is one example of a heat dissipating member for dissipating heat, and discharges the heat transferred through the heat pipe 70 into the air. In the present embodiment, the heat sink 72 has a plurality of fins extending in the top-bottom direction. The heat sink 72 is connected to the heat pipe 70 to be able to transfer heat. Further, the heat sink 72 is arranged above the outflow opening 62 of the fan 60 and below the exhaust opening 34 of the housing 10. Therefore, the heat sink 72 is arranged between the outflow opening 62 of the fan 60 and the exhaust opening 34. In the thus configured heat sink 72, if the air flowing out from the outflow opening 62 of the fan 60 flows through the fins, heat is transferred from the heat sink 72 to the air.

The battery 75 is a component storing electric power. In the present embodiment, the battery 75 is a rechargeable secondary battery. The battery 75 supplies electric power to the electronic components 41 and the display panel 5. The battery 75 is a relatively large component in the electronic apparatus 1 and is held at the frame part 26 formed at the front housing half 20.

Further, in the present embodiment, the battery 75 is arranged so as to at least partially be positioned in the space X1 between the left side intake opening 35*a* and the inflow openings 61 of the fan 60. In addition, the battery 75 is arranged so as not to be positioned in the space X2 between the right side intake opening 35*b* and the inflow openings 61 of the fan 60. However, the battery 75 may be arranged so as to be positioned at each of the two spaces X1, X2 or may be arranged so as not to be positioned at either. Further, the battery 75 may be arranged more in proximity to the space X1 between the left side intake opening 35*a* and the inflow openings 61 of the fan 60 than the space X2 between the right side intake opening 35*b* and the inflow openings 61 of the fan 60.

The fasteners 81 to 83 are used for attaching the front housing half 20 (in particular, the front metal sheet 28), the board 40, and the back metal sheet 50 to each other. In the present embodiment, the fasteners 81 to 83 are made of metal, but may be formed by other materials so long as materials having thermal conductivity and materials having electrical conductivity.

Figure 8:
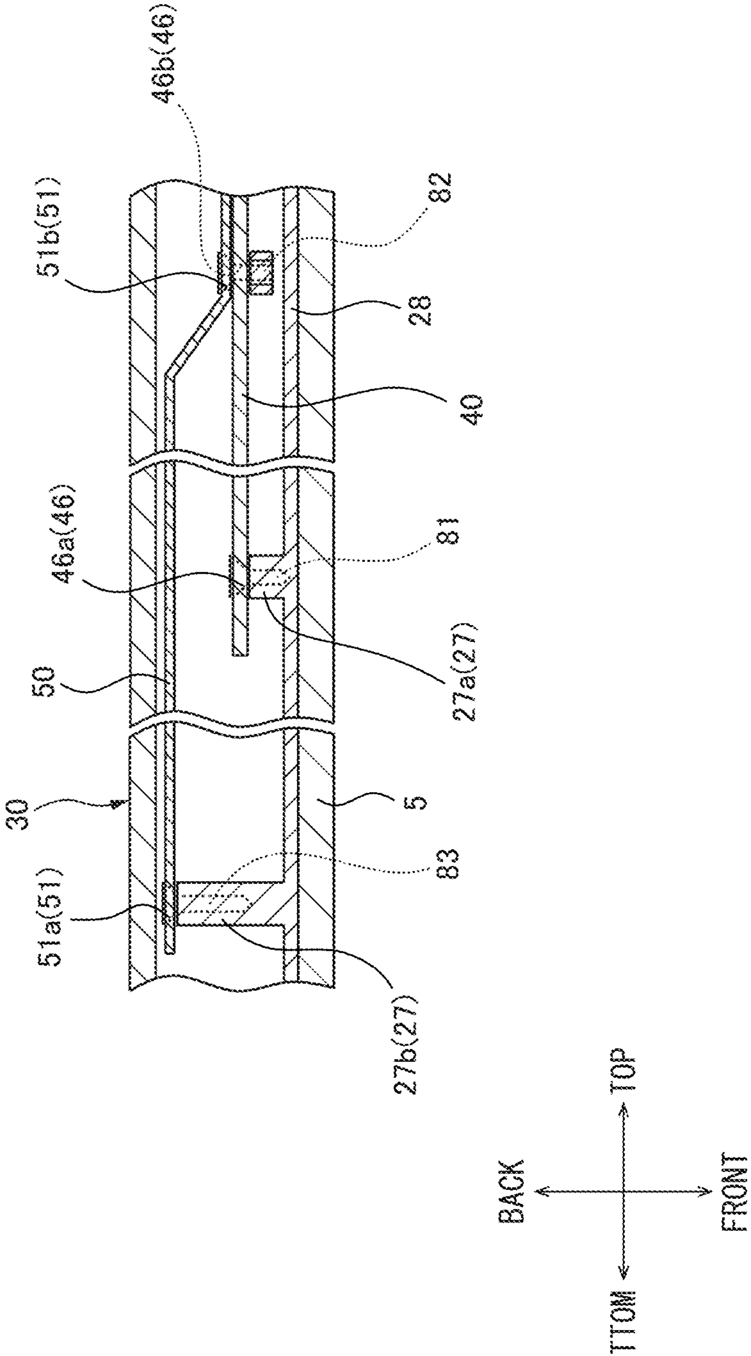
FIG. 8 is a cross-sectional view schematically showing a state where a front metal sheet, board, and back metal sheet are attached to each other by fasteners.

FIG. 8 is a cross-sectional view schematically showing a state where the front metal sheet 28, board 40, and back metal sheet 50 are attached to each other by the fasteners 81 to 83. As shown in FIG. 8, the first fasteners 81 pass through the first board openings 46*a* formed at the board 40 and are attached to the board fastening holes 27*a* of the front metal sheet 28. As a result, the board 40 is fastened to the front metal sheet 28, and the board 40 and the front metal sheet 28 are connected to be able to transfer heat. Further, the ground pattern 47 of the board 40 is electrically connected to the front metal sheet 28.

The second fastener 82 passes through the second board opening 46*b* formed in the board 40 and the second metal sheet opening 51*b* formed in the back metal sheet 50, and is fastened by a nut. As a result, the board 40 is fastened to the back metal sheet 50, and the board 40 and the back metal sheet 50 are connected to be able to transfer heat. Further, the ground pattern 47 of the board 40 is electrically connected to the back metal sheet 50. The third fasteners 83 pass through the first metal sheet openings 51*a* formed in the back metal sheet 50 and are attached to the metal sheet fastening holes 27*b* of the front metal sheet 28. As a result, the back metal sheet 50 is fastened to the front metal sheet

28, and the back metal sheet 50 and the front metal sheet 28 are connected to be able to transfer heat. Further, the back metal sheet 50 is electrically connected to the front metal sheet 28.

Relationship Between Components

Next, referring to FIGS. 6 and 7, the relationship among the components of the electronic apparatus 1 will be explained. As shown in FIGS. 6 and 7, the front metal sheet 28 is positioned at the front of the board 40. Air flowing into the housing 10 through the intake openings 35 when the fan 60 is driven flows into the space between the front surface (second surface) of the board 40 and the back surface of the front metal sheet 28. Therefore, between the front surface of the board 40 and the back surface of the front metal sheet 28, a flow path 91 of air (second flow path, below, referred to as the "front flow path") is formed. Further, as explained above, if the front metal sheet 28 is a separate member from the front main wall 21 of the front housing half 20, the front flow path 91 is formed between the front surface of the board 40 and the back surface of the front metal sheet 28 or the back surface of the front main wall 21. Therefore, the front flow path 91 is formed between the front surface of the board 40 and the front surface side facing surface (second facing surface) facing the front surface of the board 40. In other words, the front flow path 91 includes the space between the front surface of the board 40 and the front surface side facing surface. The front flow path 91 guides the air flowing into the housing 10 through the intake openings 35 to the inflow openings 61 of the fan 60.

As shown in FIG. 7, the front side electronic components 42 are arranged in the front flow path 91. In particular, the component with the largest average amount of heat generated or the largest maximum amount of heat generated among the front side electronic components 42 is arranged in the front flow path 91.

Further, as shown in FIGS. 6 and 7, the back metal sheet 50 and the back main wall 31 are positioned at the back of the board 40. Air flowing into the housing 10 through the intake openings 35 when the fan 60 is driven flows into the space between the back surface (first surface) of the board 40 and the front surface of the back metal sheet 50 or the front surface of the back main wall 31. Therefore, a flow path 92 of air (first flow path, below, referred to as the "back flow path") is formed between the back surface of the board 40 and the front surface of the back metal sheet 50 or the front surface of the back main wall 31. Further, as explained above, if the back metal sheet 50 is integrally formed with the back main wall 31 of the back housing half 30, the back flow path 92 is formed between the back surface of the board 40 and the front surface of the back metal sheet 50. Therefore, the back flow path 92 is formed between the back surface of the board 40 and the back surface side facing surface (first facing surface) facing the back surface of the board 40. In other words, the back flow path 92 includes the space between the back surface of the board 40 and the back surface side facing surface. The back flow path 92 guides the air flowing into the housing 10 through the intake openings 35 to the inflow openings 61 of the fan 60.

As shown in FIG. 6, the back side electronic components 43 are arranged in the back flow path 92. In particular, the component with the largest average amount of heat generated or the largest maximum amount of heat generated among the back side electronic components 43 is arranged in the back flow path 92.

Further, in the present embodiment, a distance D1 between the back surface of the board 40 and the front surface of the back metal sheet 50 or the front surface of the back main wall 31 in the front-back direction is longer than a distance D2 between the front surface of the board 40 and the back surface of the front metal sheet 28. Therefore, the distance in the front-back direction of the back flow path 92 at which the back side electronic components 43 with large amounts of heat generated are provided is longer than the distance in the front-back direction of the front flow path 91 at which the front side electronic components 42 with small amounts of heat generated are provided. It should be noted that, in the example shown in FIGS. 6 and 7, the distance D2 between the front surface of the board 40 and the back surface of the front metal sheet 28 is constant. Further, the distance D1 between the back surface of the board 40 and the front surface of the back metal sheet 50 is constant. However, for example, if the front metal sheet 28 or the back metal sheet 50 has a shape having uneven surfaces, the distance between the front surface of the board 40 and the back surface of the front metal sheet 28 and the distance between the back surface of the board 40 and the front surface of the back metal sheet 50 are not constant. In such a case, the average distance D1 between the back surface of the board 40 and the front surface of the back metal sheet 50 or the front surface of the back main wall 31 is longer than the average distance D2 between the front surface of the board 40 and the back surface of the front metal sheet 28. Alternatively, the maximum distance D1 between the back surface of the board 40 and the front surface of the back metal sheet 50 or the front surface of the back main wall 31 is longer than the maximum distance D2 between the front surface of the board 40 and the back surface of the front metal sheet 28.

Furthermore, the fan 60 has a back surface 63 (fan first surface) and a front surface 64 at an opposite side to the back surface 63 (fan second surface). The back surface 63 is provided with a first inflow opening 61*a*, while the front surface 64 is provided with a second inflow opening 61*b*. As shown in FIG. 7, the back surface 63 of the fan 60 faces the back main wall 31, while the front surface 64 of the fan 60 faces the front metal sheet 28. In the present embodiment, the distance between the back surface 63 of the fan 60 and the front surface of the back main wall 31 which is the facing surface to the back surface 63 of the fan 60 is longer than the distance between the front surface 54 of the fan 60 and the back surface of the front metal sheet 28 which is the facing surface to the front surface 64 of the fan 60. Therefore, the distance between the first inflow opening 61*a* formed at the back surface 63 of the fan 60 and the front surface of the back main wall 31 (i.e., the facing surface of the back surface 63 of the fan 60) is longer than the distance between the second inflow opening 61*b* formed at the front surface 64 of the fan 60 and the back surface of the front metal sheet 28 (i.e., the facing surface of the front surface 64 of the fan 60).

Further, in the present embodiment, as shown in FIG. 6, the back heat conductive sheet 86 is provided between the heat pipe 70 and the back metal sheet 50 in the region near the mounting hardware 45. The back heat conductive sheet 86 is a sheet having thermal conductivity. The back heat conductive sheet 86 is arranged so as to contact the heat pipe 70 and the back metal sheet 50. Therefore, heat is transferred between the mounting hardware 45 and the back metal sheet 50 through the back heat conductive sheet 86. As a result, between the back side electronic components 43, in particular, the first back side electronic component 43*a*, and the back metal sheet 50, the shield member 44, mounting hardware 45, heat pipe 70 and back heat conductive sheet 86 are arranged in layers in the front-back direction. These are connected to be able to transfer heat. Therefore, the shield member 44, mounting hardware 45, heat pipe 70, and back heat conductive sheet 86 function as heat conductive connecting members (first connecting members) connecting the back side electronic components 43, in particular the first back side electronic component 43*a*, and the back metal sheet 50 to be able to transfer heat with each other. Due to this, when the amount of heat generated of the back side electronic components 43, in particular, the first back side electronic component 43*a*, is large, the heat generated is transferred to the heat sink 72 through the heat pipe 70 and is transferred to the back metal sheet 50 through these layered components.

It should be noted that, the back heat conductive sheet 86 may be arranged in any way so long as able to connect at least one of the back side electronic components 43 and the back metal sheet 50 to be able to transfer heat. Therefore, for example, it may be arranged so as to contact both the back side electronic components 43 and the back metal sheet 50. Further, another element may be used, instead of the back heat conductive sheet 86, as long as the element having thermal conductivity. Therefore, instead of the back heat conductive sheet 86, heat conductive grease may be used.

In addition, in the present embodiment, as shown in FIG. 8, the board 40 and the back metal sheet 50 are attached to each other by a second fastener 82 having thermal conductivity. Therefore, the board 40 and the back metal sheet 50 are connected to each other by the second fastener 82 so as to be able to transfer heat. Accordingly, the second fastener 82 functions as a heat conductive connecting member (first connecting member) connecting the board 40 and the back metal sheet 50 together to be able to transfer heat without interposing a back side electronic component 43. It should be noted that, as such a connecting member, another part other than a fastener such as a screw, or bolt may be used so long as the part is a heat conductive member connected to be able to transfer heat.

Furthermore, in the present embodiment, as shown in FIG. 7, a front heat conductive sheet 85 is provided between the second front side electronic component 42*b* and the front metal sheet 28 in the front-back direction. The front heat conductive sheet 85 is a sheet having thermal conductivity. The front heat conductive sheet 85 is arranged so as to contact the second front side electronic component 42*b* and the front metal sheet 28. Therefore, heat is transferred through the front heat conductive sheet 85 between the second front side electronic component 42*b* and the front metal sheet 28. For this reason, the front heat conductive sheet 85 functions as a heat conductive connecting member (second connecting member) connecting the front side electronic component 42 and the front metal sheet 28 to be able to transfer heat to each other. Due to this, when the amount of heat generated of the second front side electronic component 42*b* is large, the generated heat is transferred to the front metal sheet 28 through the front heat conductive sheet 85.

It should be noted that, the front heat conductive sheet 85 may be arranged in any way as long as able to connect at least one of the front side electronic components 42 and the front metal sheet 28 to be able to transfer heat. Therefore, for example, another component having thermal conductivity may be arranged between the front side electronic components 42 and the front heat conductive sheet 85 or between the front metal sheet 28 and the front heat conductive sheet 85. Further, another component may be used instead of the front heat conductive sheet 85 so long as the component having thermal conductivity. Therefore, instead of the front heat conductive sheet 85, heat conductive grease may be used.

In addition, in the present embodiment, as shown in FIG. 8, the board 40 and the front metal sheet 28 are attached to each other by the first fasteners 81 having thermal conductivity. Therefore, the board 40 and the front metal sheet 28 are connected to each other by the first fasteners 81 to be able to transfer heat. Accordingly, the first fasteners 81 function as heat conducting connecting members (second connecting members) connecting the board 40 and the front metal sheet 28 to be able to transfer heat with each other without interposing front side electronic components 42. It should be noted that, as such connecting members, parts other than screws, bolts or other fasteners may be used so long as the parts being heat conductive members connecting members to be able to transfer heat.

Further, as explained above, in the present embodiment, the number of the first fasteners 81 is greater than the number of the second fasteners 82. Therefore, the first fasteners 81 are configured so as to more easily transfer heat compared with the second fasteners. It should be noted that, if the first fasteners 81 are configured so as to more easily transfer heat compared with the second fasteners, the first fasteners 81 and second fasteners 82 may be configured in any way. Therefore, for example, the same numbers of the first fasteners 81 with the relatively larger cross-sectional areas and of the second fasteners 82 with the relatively smaller cross-sectional areas may be provided. Alternatively, the first fasteners 81 may be formed by a material with a higher thermal conductivity than the second fasteners 82. In this case, the number of the first fasteners 81 and the number of the second fasteners 82 may be the same.

Further, in the present embodiment, the number of the first connecting members including the first fasteners 81, front heat conductive sheet 85, etc., is greater than the number of the second connecting members including the second fasteners 82, back heat conductive sheet 86, etc. Therefore, the first connecting members are configured so as to become easier to transfer heat compared with the second connecting members. It should be noted that, as long as the first connecting members are configured so as to become easier to transfer heat compared with the second connecting members, the first connecting members and second connecting members may be configured in any way. Therefore, for example, the same numbers of the first connecting members with the relatively larger cross-sectional areas and of the second connecting members with the relatively smaller cross-sectional areas may be provided. Alternatively, the first connecting members may be formed by a material with a higher thermal conductivity than the second connecting members. In this case, the number of the first connecting members and the number of the second connecting members may be the same.

Furthermore, in the present embodiment, as shown in FIG. 8, the front metal sheet 28 and the back metal sheet 50 are attached to each other by third fasteners 83 having thermal conductivity. Therefore, the front metal sheet 28 and the back metal sheet 50 are connected to each other by the third fasteners 83 to be able to transfer heat. Accordingly, the third fasteners 83 function as heat conducting connecting members (third connecting members) connecting the front metal sheet 28 and the back metal sheet 50 to be able to transfer heat with each other. It should be noted that, as such connecting members, parts other than screws, bolts, or other fasteners may be used so long as the parts being heat conductive members connecting members to be able to transfer heat.

Advantageous Effects

In the present embodiment, the distance in the front-back direction of the back flow path 92 in which the back side electronic components 43 with the large amounts of heat generated are provided is longer than the distance in the front-back direction of the front flow path 91 in which the front side electronic components 42 with the small amounts of heat generated are provided. As a result, the flow rate of the air flowing through the back flow path 92 in which the back side electronic components 43 with the large amounts of heat generated are provided is greater than the flow rate of the air flowing through the front flow path 91 and, accordingly, heat is easier to dissipate from the back side electronic components 43. As a result, the heat generated from the electronic components 41 generating heat can be effectively dissipated.

Further, in the present embodiment, the front metal sheet 28 is arranged facing the front surface of the board 40, while the back metal sheet 50 is arranged facing the back surface of the board 40. By the metal sheets 28, 50 with the high thermal conductivities being arranged at the front surface and back surface of the board 40 in this way, the heat generated at the electronic components 41 and the board 40 can be dispersed and as a result the heat generated from the electronic components 41 generating heat can be effectively dissipated.

Further, in the present embodiment, the back metal sheet 50 is connected with the back side electronic components 43 and the board 40 by the connecting members, such as the second fastener 82 and the back heat conductive sheet 86. As a result, the heat of the back side electronic components 43 and the board 40 can be dissipated into air flowing through the back flow path 92 via the back metal sheet 50. Similarly, in the present embodiment, the front metal sheet 28 is connected with the front side electronic components 42 and the board 40 by the connecting members, such as the first fasteners 81 and the front heat conductive sheet 85. As a result, the heat of the front side electronic component 42 and the board 40 can be dissipated into air flowing through the front flow path 91 via the front metal sheet 28.

Further, in the present embodiment, the second fastener 82 connects the back metal sheet 50 to the first interconnect pattern to be able to transfer heat. Similarly, the first fasteners 81 connect the metal sheet 28 to the second interconnect pattern to be able to transfer heat. As a result, the interconnect pattern provided at the board 40 promotes transfer of heat, therefore it is possible to quickly transfer heat of the board 40 to the metal sheets 28, 50 through the second fastener 82 and first fasteners 81.

Further, in the present embodiment, the first interconnect pattern and second interconnect pattern are electrically connected to the ground potential. The back metal sheet 50 connected to the first interconnect pattern overlaps the back side electronic components 43 when viewed in the front-back direction, while the front metal sheet 28 connected to the second interconnect pattern overlaps the front side electronic components 42 when viewed in the front-back direction. As a result, the metal sheets 28, 50 are connected to the ground potential and generation of noise from the electronic components 41 is suppressed.

Further, in the present embodiment, the distance between the back surface of the fan 60 and the front surface of the back main wall 31 which is the facing surface to the back surface of the fan 60 is longer than the distance between the front surface of the fan 60 and the back surface of the front metal sheet 28 which is the facing surface to the front surface of the fan 60. As a result, the flow rate of the air flowing through the back flow path 92 communicating with the back surface side of the fan 60 easily becomes greater than the flow rate of the air flowing through the front flow path 91 communicating with the front surface side of the fan 60 and, accordingly, heat becomes easier to dissipate from the back side electronic components 43. As a result, the heat generated from the electronic components 41 generating heat can be effectively dissipated. Further, in the present embodiment, both of the front surface and back surface sides of the fan 60 are provided with inflow openings. As a result, the flow rates of the air of the front flow path 91 and the back flow path 92 respectively communicating with the front surface side and the back surface side of the fan 60 are kept from remarkably differing from each other, and the heat generated from the electronic components 41 generating heat can be effectively dissipated.

Furthermore, in the present embodiment, the distance between the first inflow opening 61*a* formed at the back surface 63 of the fan 60 and the facing surface to the back surface 63 of the fan 60 is longer than the distance between the second inflow opening 61*b* formed at the front surface 64 of the fan 60 and the facing surface to the front surface 64 of the fan 60. As a result, a wide space is formed near the inflow openings at the back surface side of the fan 60 and accordingly heat is easily dissipated at the back surface side of the fan 60 and accordingly heat becomes easily dissipated from the back side electronic components 43.

Further, in the present embodiment, the second front side electronic component 42*b* with the largest average amount of heat generated or the largest maximum amount of heat generated among the front side electronic components 42 and the first back side electronic component 43*a* with the largest average amount of heat generated or the largest maximum amount of heat generated among the back side electronic components 43 are arranged in the spaces between the plurality of intake openings 35 and the inflow openings 61 of the fan 60. As a result, the electronic components 41 with large amounts of heat generated are arranged at the main path of air in the housing 10, and accordingly dissipation of heat from the electronic components 41 with the large amounts of heat generated can be promoted. In particular, in the present embodiment, the second front side electronic component 42*b* with the largest average amount of heat generated or the largest amount of heat generated among the front side electronic components 42 and the first back side electronic component 43*a* with the largest average amount of heat generated or the largest amount of heat generated among the back side electronic components 43 are arranged in the spaces between the different intake openings 35 and the inflow openings 61 of the fan 60, therefore it is possible to keep down the effect among components with large amounts of heat generated to the smallest extent and accordingly the heat generated from the electronic components 41 generating heat can be effectively dissipated.

Further, in the present embodiment, the battery 75 is arranged in proximity to the space between the left side intake opening 35*a* and the inflow openings 61 of the fan 60, where the front side electronic components 42 with the smaller amounts of heat generated than the back side electronic components 43 are positioned. The battery 75 is a relatively large part among the components of the electronic apparatus 1, therefore if arranged in the flow path of air, it casily causes flow resistance. In the present embodiment, by arranging the battery 75 away from the space between the right side intake opening 35*b* and the inflow openings 61 of the fan 60, where the back side electronic components 43 with the large amounts of heat generated are positioned, air easily flows to the back side electronic components 43 with the large amounts of heat generated and accordingly the heat generated from the electronic components 41 generating heat can be effectively dissipated.

Further, in the present embodiment, the board 40 and the front metal sheet 28 are connected to be able to transfer heat by the first connecting members including the first fasteners 81, front heat conductive sheet 85, etc. By the board 40 and the front metal sheet 28 being connected to be able to transfer heat in this way, part of the heat of the board 40 can be dissipated into the air flowing through the front flow path 91 via the first connecting members and the front metal sheet 28. As a result, the heat of the board 40 is harder to dissipate into the air flowing through the back flow path 92 at which the back side electronic components 43 are arranged, and dissipation of heat into the air flowing through the back flow path 92 at which the back side electronic components 43 with the large amounts of heat generated can be promoted. For this reason, the heat generated from the electronic components 41 generating heat can effectively be dissipated.

Further, in the present embodiment, the number of the first connecting members including first fasteners 81, front heat conductive sheets 85, etc., is greater than the number of the second connecting members including second fasteners 82, back heat conductive sheets 86, etc. Therefore, the first connecting members are configured so as to more easily conduct heat than the second connecting members. As a result, a lot of the heat of the board 40 can be transferred by the front metal sheet 28 through the first connecting members. Due to this, the heat of the board 40 is harder to dissipate at the back flow path 92 at which the back side electronic components 43 are arranged, and dissipation of heat into the air flowing through the back flow path 92 from the back side electronic components 43 with the large amount of heat generated can be promoted. For this reason, the heat generated from the electronic components 41 generating heat can effectively be dissipated.

Further, in the present embodiment, the first connecting members including the first fasteners 81, the front heat conductive sheet 85, etc., are formed of a material with a higher thermal conductivity than the second connecting members including the second fasteners 82, the back heat conductive sheet 86, etc. Therefore, the first connecting members are formed so as to more easily transfer heat compared with the second connecting members. As a result, the heat generated from the electronic component 41 generating heat can be effectively dissipated.

Further, in the present embodiment, in addition to the first connecting members and the second connecting members, third connecting members including third fasteners 83 are provided so as to connect the front metal sheet 28 and the back metal sheet 50 to be able to transfer heat. As a result, heat can be dispersed by the front metal sheet 28 and the back metal sheet 50 and accordingly local generation of heat can be suppressed.

Further, in the present embodiment, the interconnect pattern connected to the front side electronic components 42 to be able to transfer heat is connected to the first connecting members to be able to transfer heat. For this reason, heat generated at the front side electronic components 42 can be transferred to the front metal sheet 28 through the interconnect pattern and the first connecting members. As a result, heat generated at the front side electronic components 42 can be dispersed to the front metal sheet 28, and local generation of heat can be suppressed.

Further, in the present embodiment, the back metal sheet 50 and the front metal sheet 28 are electrically connected to the ground potential. Further, the back metal sheet 50 overlaps the back side electronic components 43 when viewed in the front-back direction, while the front metal sheet 28 overlaps the front side electronic components 42 when viewed in the front-back direction. As a result, the metal sheets 28, 50 are connected to the ground potential and generation of noise from the electronic components 41 is suppressed.

Further, in the present embodiment, the front side electronic components 42 and the back side electronic components 43 are arranged at positions not overlapping each other in the front-back direction. Due to this, the heat generated at the board 40 is dispersed. Further, air flowing in from the separate intake openings flow through the front side electronic components 42 and the back side electronic components 43 whereby the heat generated from the electronic components 41 generating heat can be effectively dissipated.

Further, in the present embodiment, the metal forming the back metal sheet 50 has a lower thermal conductivity and larger specific gravity than the metal forming the front metal sheet 28. Due to this, the thermal conductivity of the metal sheet at the back side electronic component 43 side with the relatively large amount of heat generated is higher, and therefore the heat is easier to disperse, while the specific gravity of the metal sheet at the front side electronic component 42 side with the relatively small amount of heat generated can be made smaller. Accordingly, it is possible to suppress an increase in weight of the electronic apparatus 1 as a whole, while effectively dissipating heat generated from the electronic components 41. In particular, by arranging the back metal sheet 50 so as to face the first back side electronic component 43*a* with the largest amount of heat generated while making the area of the back metal sheet 50 smaller, it is possible to suppress a drop in the effect of heat dissipation while suppressing an increase in weight of the electronic apparatus 1.

Further, in the present embodiment, the perimeter of the front metal sheet 28 is surrounded by the plastic member. If the metal frame becomes larger in area, it becomes weaker with respect to bending or other plastic deformation, but in the present embodiment, the perimeter of the front metal sheet 28 is surrounded by the plastic member, therefore it is possible to suppress plastic deformation.

Further, in the present embodiment, the plastic member is configured so as substantially not cover the front surface and back surface of the front metal sheet 28. Due to this, heat becomes easier to disperse from the front metal sheet 28 to the front. Due to the plastic member being provided, a drop in the rigidity of the electronic apparatus 1 can be suppressed.

Further, in the present embodiment, the heat generated from the front side electronic components 42 is dissipated through the heat conductive sheet or the like, while the heat generated from the back side electronic components 43 is dissipated through the heat pipe or the like. In this way, the heat generated from the back side electronic components 43 where the amounts of heat generated are relatively large is dissipated through the heat pipe with the large heat dissipation effect, while the heat generated from the front side electronic components 42 where the amounts of heat generated are relatively small is dissipated without using a heat pipe or the like which take up space in the electronic apparatus 1, whereby it is possible to raise the heat dissipation effect while conserving on space.

Above, preferred embodiments according to the present disclosure were explained, but the present disclosure is not limited to these embodiments and can be corrected and changed in various ways within the scope of the claims.

The invention claimed is:

1. An electronic apparatus to and from which air from the outside flows, the electronic apparatus comprising:

a housing at which an intake opening is provided;

a fan housed in the housing;

a board housed in the housing;

one or more first heat generating component mounted on a first surface of the board; and one or more second heat generating component mounted on a second surface of the board at an opposite side to the first surface, wherein a first flow path and a second flow path guiding air flowing in from the intake opening to the fan are formed in the housing, the first flow path is formed at least in part by the first surface and a first facing surface facing the first surface, the second flow path is formed at least in part by the second surface and a second facing surface facing the second surface, in a direction perpendicular to the board, a distance between the first surface and the first facing surface at the first flow path is longer than a distance between the second surface and the second facing surface at the second flow path, and a total amount of heat generated of the first heat generating components as a whole is larger than a total amount of heat generated of the second heat generating components as a whole, or an amount of heat generated by a component with a largest amount of heat generated among the first heat generating components is larger than an amount of heat generated by a component with a largest amount of heat generated among the second heat generating components.

2. The electronic apparatus according to claim 1, wherein the first facing surface is formed by a first metal sheet arranged so as to face the first surface, the second facing surface is formed by a second metal sheet arranged so as to face the second surface, and at least part of the housing is formed by the first metal sheet or the second metal sheet.

3. The electronic apparatus according to claim 2, wherein the first metal sheet is connected to at least one of the first heat generating component and the board by a heat conductive first connecting member.

4. The electronic apparatus according to claim 2, wherein the second metal sheet is connected to at least one of the second heat generating component and the board by a heat conductive second connecting member.

5. The electronic apparatus according to claim 3, wherein at least a part of the first connecting members connects the first metal sheet and a first interconnect pattern provided at the board.

6. The electronic apparatus according to claim 5, wherein the first interconnect pattern is electrically connected to a ground potential of the electronic apparatus, and the first metal sheet is arranged so as to overlap at least a part of the first heat generating components when viewed in a direction perpendicular to the board.

7. The electronic apparatus according to claim 4, wherein at least a part of the second connecting members connects the second metal sheet and a second interconnect pattern provided at the board.

8. The electronic apparatus according to claim 7, wherein the second interconnect pattern is electrically connected to a ground potential of the electronic apparatus, and the second metal sheet is arranged so as to overlap at least a part of the second heat generating components when viewed in a direction perpendicular to the board.

9. The electronic apparatus according to claim 2, wherein the fan is attached at the second metal sheet, has a fan second surface facing the second metal sheet in a direction perpendicular to the board and a fan first surface at the opposite side to the fan second surface, and has an inflow opening formed at the fan first surface and an inflow opening formed at the fan second surface, the first facing surface faces the inflow opening formed at the fan first surface while the second facing surface faces the inflow opening formed at the fan second surface, and a distance between the inflow opening formed at the fan first surface and the first facing surface is longer than a distance between the inflow opening formed at the fan second surface and the second facing surface.

10. The electronic apparatus according to claim 1, wherein the component with the largest amount of heat generated among the first heat generating components is arranged so as to be at least partially positioned in a space between the intake opening and the inflow openings of the fan when viewed in a direction perpendicular to the board.

11. The electronic apparatus according to claim 1, wherein a component with a largest amount of heat generated among the second heat generating components is arranged so as to at least partially be positioned in a space between the intake openings and the inflow openings of the fan when viewed in a direction perpendicular to the board.

12. The electronic apparatus according to claim 1, wherein the intake opening has two intake openings of a first intake opening and second intake opening arranged away from each other on the same surface of the housing, a component with a largest amount of heat generated among the first heat generating components is arranged so as to at least partially be positioned in a space between the first intake opening and an inflow opening of the fan when viewed in a direction perpendicular to the board, and a component with a largest amount of heat generated among the second heat generating components is arranged so as to at least partially be positioned in a space between the second intake opening and the inflow opening when viewed in a direction perpendicular to the board.

13. The electronic apparatus according to claim 12, further comprising a battery arranged in the housing, wherein the battery is arranged more in proximity to a space between the second intake opening and the inflow opening than a space between the first intake opening and the inflow opening.

* * * * *